United States Patent
Zhou et al.

(10) Patent No.: US 6,994,151 B2
(45) Date of Patent: Feb. 7, 2006

(54) VAPOR ESCAPE MICROCHANNEL HEAT EXCHANGER

(75) Inventors: Peng Zhou, Albany, CA (US); Kenneth Goodson, Belmont, CA (US); Juan Suntiago, Fremont, CA (US)

(73) Assignee: Cooligy, Inc., Mountain View, CA (US)

( * ) Notice: Subject to any disclaimer, the term of this patent is extended or adjusted under 35 U.S.C. 154(b) by 0 days.

(21) Appl. No.: 10/366,128

(22) Filed: Feb. 12, 2003

(65) Prior Publication Data

US 2004/0104012 A1 Jun. 3, 2004

Related U.S. Application Data

(60) Provisional application No. 60/420,557, filed on Oct. 22, 2002.

(51) Int. Cl.
*F28F 7/00* (2006.01)

(52) U.S. Cl. .............................. 165/80.4; 165/104.21; 165/104.33; 165/104.26; 361/700; 174/15.1; 257/715

(58) Field of Classification Search ............ 165/104.21, 165/104.33, 104.26, 185, 80.3; 174/15.2; 361/700; 257/715
See application file for complete search history.

(56) References Cited

U.S. PATENT DOCUMENTS

| ,596,062 A | 12/1897 | Firey |
| 2,039,593 A | 5/1936 | Hubbuch et al. |
| 2,273,505 A | 2/1942 | Florian |
| 3,361,195 A | 1/1968 | Meyerhoff et al. |

(Continued)

FOREIGN PATENT DOCUMENTS

| JP | 1-256775 | 10/1989 |
| JP | 10-99592 | 4/1998 |
| JP | 2000-277540 | 10/2000 |
| JP | 2001-326311 | 11/2001 |

OTHER PUBLICATIONS

Stephen C. Jacobson et al., "Fused Quartz Substrates for Microchip Electrophoresis", Analytical Chemistry, Vo. 67, No. 13, Jul. 1, 1995, pp. 2059–2063.

Kendra V. Sharp et al., "Liquid Flows in Microchannels", 2002, vol. 6, pp. 6–1 to 6–38.

Shuchi Shoji et al., "Microflow devices and systems", J. Microcech. Microeng. 4 (1994), pp. 157–171, printed in the U.K.

(Continued)

*Primary Examiner*—Terrell McKinnon
(74) *Attorney, Agent, or Firm*—Haverstock & Owens LLP

(57) ABSTRACT

A vapor escape membrane for use in a heat exchanging device, including a heat pipe or heat sink that runs liquid into a cooling region positioned adjacent to the heat producing device, the vapor escape membrane comprising: a porous surface for removing vapor produced from the liquid in the cooling region, the membrane configured to confine the liquid only within the cooling region. The vapor escape membrane transfers vapor to a vapor region within the heat exchanging device, wherein the membrane is configured to prevent liquid in the cooling region from entering the vapor region. The membrane is configured to include a hydrophobic surface between the membrane and the cooling region, wherein the liquid in the cooling region does not flow through the porous surface. The vapor escape membrane includes a plurality of apertures for allowing vapor to transfer therethrough, each of the apertures having a predetermined dimension.

69 Claims, 9 Drawing Sheets

U.S. PATENT DOCUMENTS

| | | | | |
|---|---|---|---|---|
| 3,771,219 A | | 11/1973 | Tuzi et al. | |
| 3,817,321 A | | 6/1974 | von Cube et al. | |
| 3,948,316 A | | 4/1976 | Souriau | |
| 4,109,707 A | | 8/1978 | Wilson et al. | |
| 4,211,208 A | | 7/1980 | Lindner | |
| 4,312,012 A | | 1/1982 | Frieser et al. | 357/82 |
| 4,450,472 A | | 5/1984 | Tuckerman et al. | 357/82 |
| 4,467,861 A | * | 8/1984 | Kiseev et al. | 165/104.22 |
| 4,485,429 A | | 11/1984 | Mittal | |
| 4,516,632 A | | 5/1985 | Swift et al. | 165/167 |
| 4,540,115 A | | 9/1985 | Hawrylo | |
| 4,561,040 A | | 12/1985 | Eastman et al. | 361/385 |
| 4,567,505 A | | 1/1986 | Pease et al. | 357/81 |
| 4,573,067 A | | 2/1986 | Tuckerman et al. | 357/82 |
| 4,574,876 A | | 3/1986 | Aid | |
| 4,644,385 A | | 2/1987 | Nakanishi et al. | |
| 4,758,926 A | | 7/1988 | Herrell et al. | 361/385 |
| 4,866,570 A | | 9/1989 | Porter | |
| 4,868,712 A | | 9/1989 | Woodman | 361/388 |
| 4,893,174 A | | 1/1990 | Yamada et al. | |
| 4,894,709 A | | 1/1990 | Phillips et al. | 357/82 |
| 4,896,719 A | | 1/1990 | O'Neill et al. | |
| 4,903,761 A | * | 2/1990 | Cima | 165/104.25 |
| 4,908,112 A | | 3/1990 | Pace | 204/299 R |
| 4,938,280 A | | 7/1990 | Clark | 165/80.4 |
| 5,009,760 A | | 4/1991 | Zare et al. | |
| 5,016,090 A | | 5/1991 | Galyon et al. | |
| 5,016,138 A | | 5/1991 | Woodman | 361/381 |
| 5,043,797 A | | 8/1991 | Lopes | |
| 5,057,908 A | | 10/1991 | Weber | 357/81 |
| 5,070,040 A | | 12/1991 | Pankove | 437/209 |
| 5,083,194 A | | 1/1992 | Bartilson | 357/81 |
| 5,088,005 A | | 2/1992 | Ciaccio | |
| 5,099,311 A | | 3/1992 | Bonde et al. | 357/82 |
| 5,099,910 A | | 3/1992 | Walpole et al. | 165/80.4 |
| 5,125,451 A | | 6/1992 | Matthews | 165/80.4 |
| 5,131,233 A | | 7/1992 | Cray et al. | 62/64 |
| 5,161,089 A | | 11/1992 | Chu et al. | |
| 5,179,500 A | | 1/1993 | Koubek et al. | 361/385 |
| 5,203,401 A | | 4/1993 | Hamburgen et al. | 165/80.4 |
| 5,218,515 A | | 6/1993 | Bernhardt | 361/385 |
| 5,228,502 A | | 7/1993 | Chu et al. | |
| 5,230,564 A | | 7/1993 | Bartilson et al. | 374/178 |
| 5,232,047 A | | 8/1993 | Matthews | 165/168 |
| 5,239,200 A | | 8/1993 | Messina et al. | 257/714 |
| 5,239,443 A | | 8/1993 | Fahey et al. | |
| 5,263,251 A | | 11/1993 | Matthews | 29/840.036 |
| 5,265,670 A | | 11/1993 | Zingher | |
| 5,269,372 A | | 12/1993 | Chu et al. | |
| 5,274,920 A | | 1/1994 | Mathews | 29/890.039 |
| 5,275,237 A | | 1/1994 | Rolfson et al. | |
| 5,281,026 A | | 1/1994 | Bartilson et al. | 374/143 |
| 5,308,429 A | | 5/1994 | Bradley | |
| 5,309,319 A | | 5/1994 | Messina | 361/699 |
| 5,310,440 A | | 5/1994 | Zingher | |
| 5,316,077 A | | 5/1994 | Reichard | |
| 5,317,805 A | | 6/1994 | Hoopman et al. | 29/890.03 |
| 5,325,265 A | | 6/1994 | Turlik et al. | 361/702 |
| 5,346,000 A | * | 9/1994 | Schlitt | 165/104.26 |
| 5,380,956 A | | 1/1995 | Loo et al. | |
| 5,383,340 A | | 1/1995 | Larson et al. | 62/259.2 |
| 5,386,143 A | | 1/1995 | Fitch | |
| 5,388,635 A | | 2/1995 | Gruber et al. | |
| 5,421,943 A | | 6/1995 | Tam et al. | |
| 5,427,174 A | * | 6/1995 | Lomolino et al. | 165/104.13 |
| 5,436,793 A | | 7/1995 | Sanwo et al. | 361/689 |
| 5,459,099 A | | 10/1995 | Hsu | 437/180 |
| 5,490,117 A | | 2/1996 | Oda et al. | |
| 5,508,234 A | | 4/1996 | Dusablon, Sr. et al. | 437/228 |
| 5,514,832 A | | 5/1996 | Dusablon, Sr. et al. | 174/15.1 |
| 5,514,906 A | | 5/1996 | Love et al. | 257/712 |
| 5,544,696 A | | 8/1996 | Leland | |
| 5,548,605 A | | 8/1996 | Benett et al. | |
| 5,575,929 A | | 11/1996 | Yu et al. | 216/10 |
| 5,585,069 A | | 12/1996 | Zanzucchi et al. | |
| 5,641,400 A | | 6/1997 | Kaltenbach et al. | 210/198.2 |
| 5,658,831 A | | 8/1997 | Layton et al. | |
| 5,675,473 A | | 10/1997 | McDunn et al. | |
| 5,692,558 A | | 12/1997 | Hamilton et al. | 165/80.4 |
| 5,696,405 A | | 12/1997 | Weld | 257/714 |
| 5,703,536 A | | 12/1997 | Davis et al. | 330/289 |
| 5,704,416 A | | 1/1998 | Larson et al. | 165/104.33 |
| 5,727,618 A | | 3/1998 | Mundinger et al. | 165/80.4 |
| 5,740,013 A | | 4/1998 | Roesner et al. | |
| 5,763,951 A | | 6/1998 | Hamilton et al. | |
| 5,768,104 A | | 6/1998 | Salmonson et al. | |
| 5,774,779 A | | 6/1998 | Tuchinskiy | 419/2 |
| 5,800,690 A | | 9/1998 | Chow et al. | |
| 5,801,442 A | | 9/1998 | Hamilton et al. | 257/714 |
| 5,839,290 A | * | 11/1998 | Nazeri | 62/119 |
| 5,921,087 A | | 7/1999 | Bhatia et al. | |
| 5,945,217 A | * | 8/1999 | Hanrahan | 428/389 |
| 5,978,220 A | | 11/1999 | Frey et al. | |
| 5,993,750 A | | 11/1999 | Ghosh et al. | |
| 5,997,713 A | | 12/1999 | Beetz, Jr. et al. | |
| 5,998,240 A | | 12/1999 | Hamilton et al. | |
| 6,007,309 A | | 12/1999 | Hartley | |
| 6,019,165 A | | 2/2000 | Batchelder | |
| 6,023,934 A | | 2/2000 | Gold | 62/51.1 |
| 6,034,872 A | | 3/2000 | Chrysler et al. | |
| 6,039,114 A | | 3/2000 | Becker et al. | |
| 6,054,034 A | | 4/2000 | Soane et al. | 204/601 |
| 6,068,752 A | | 5/2000 | Dubrow et al. | |
| 6,090,251 A | | 7/2000 | Sundberg et al. | |
| 6,096,656 A | | 8/2000 | Matzke et al. | |
| 6,100,541 A | | 8/2000 | Nagle et al. | |
| 6,101,715 A | | 8/2000 | Fuesser et al. | |
| 6,119,729 A | | 9/2000 | Oberholzer et al. | |
| 6,126,723 A | | 10/2000 | Drost et al. | |
| 6,129,145 A | | 10/2000 | Yamamoto et al. | |
| 6,129,260 A | | 10/2000 | Andrus et al. | |
| 6,131,650 A | | 10/2000 | North et al. | |
| 6,140,860 A | | 10/2000 | Sandhu et al. | |
| 6,146,103 A | | 11/2000 | Lee et al. | |
| 6,159,353 A | | 12/2000 | West et al. | |
| 6,167,948 B1 | | 1/2001 | Thomas | |
| 6,174,675 B1 | | 1/2001 | Chow et al. | |
| 6,176,962 B1 | | 1/2001 | Soane et al. | |
| 6,182,742 B1 | | 2/2001 | Takahashi et al. | 165/104.33 |
| 6,186,660 B1 | | 2/2001 | Kopf-Sill et al. | |
| 6,206,022 B1 | | 3/2001 | Tsai et al. | |
| 6,210,986 B1 | | 4/2001 | Arnold et al. | |
| 6,216,343 B1 | | 4/2001 | Leland et al. | |
| 6,221,226 B1 | | 4/2001 | Kopf-Sill | |
| 6,234,240 B1 | | 5/2001 | Cheon | 165/80.3 |
| 6,238,538 B1 | | 5/2001 | Parce et al. | 204/600 |
| 6,253,832 B1 | | 7/2001 | Hallefalt | |
| 6,253,835 B1 | | 7/2001 | Chu et al. | |
| 6,257,320 B1 | | 7/2001 | Wargo | |
| 6,277,257 B1 | | 8/2001 | Paul et al. | 204/450 |
| 6,301,109 B1 | | 10/2001 | Chu et al. | |
| 6,313,992 B1 | | 11/2001 | Hildebrandt | |
| 6,317,326 B1 | | 11/2001 | Vogel et al. | |
| 6,321,791 B1 | | 11/2001 | Chow | |
| 6,322,753 B1 | | 11/2001 | Lindberg et al. | |
| 6,324,058 B1 | | 11/2001 | Hsiao | |
| 6,330,907 B1 | * | 12/2001 | Ogushi et al. | 165/104.26 |
| 6,336,497 B1 | * | 1/2002 | Lin | 165/80.3 |
| 6,337,794 B1 | | 1/2002 | Agonafer et al. | |
| 6,351,384 B1 | | 2/2002 | Daikoku et al. | |
| 6,366,462 B1 | | 4/2002 | Chu et al. | |

| | | |
|---|---|---|
| 6,366,467 B1 | 4/2002 | Patel et al. |
| 6,367,544 B1 | 4/2002 | Calaman |
| 6,388,317 B1 | 5/2002 | Reese .................... 257/713 |
| 6,396,706 B1 | 5/2002 | Wohlfarth |
| 6,397,932 B1 | 6/2002 | Calaman et al. |
| 6,400,012 B1 | 6/2002 | Miller et al. |
| 6,406,605 B1 | 6/2002 | Moles |
| 6,415,860 B1 | 7/2002 | Kelly et al. .................. 165/748 |
| 6,417,060 B2 | 7/2002 | Tavkhelidze et al. |
| 6,424,531 B1 | 7/2002 | Bhatti et al. |
| 6,431,260 B1 | 8/2002 | Agonafer et al. |
| 6,437,981 B1 | 8/2002 | Newton et al. |
| 6,438,984 B1 | 8/2002 | Novotny et al. |
| 6,443,222 B1 | 9/2002 | Yun et al. |
| 6,444,461 B1 | 9/2002 | Knapp et al. |
| 6,457,515 B1 | 10/2002 | Vafai et al. |
| 6,459,581 B1 | 10/2002 | Newton et al. |
| 6,466,442 B2 * | 10/2002 | Lin ........................ 361/695 |
| 6,477,045 B1 | 11/2002 | Wang |
| 6,492,200 B1 | 12/2002 | Park et al. |
| 6,519,151 B2 | 2/2003 | Chu et al. |
| 6,533,029 B1 * | 3/2003 | Phillips ................. 165/104.26 |
| 6,536,516 B2 | 3/2003 | Davies et al. |
| 6,537,437 B1 | 3/2003 | Galambos et al. |
| 6,543,521 B1 | 4/2003 | Sato et al. |
| 6,553,253 B1 | 4/2003 | Chang |
| 6,578,626 B1 | 6/2003 | Calaman et al. |
| 6,581,388 B2 | 6/2003 | Novotny et al. |
| 6,587,343 B2 | 7/2003 | Novotny et al. |
| 6,588,498 B1 | 7/2003 | Reyzin et al. |
| 6,591,625 B1 | 7/2003 | Simon |
| 6,600,220 B2 | 7/2003 | Barber et al. |
| 6,601,643 B2 * | 8/2003 | Cho et al. ............... 165/104.26 |
| 6,606,251 B1 | 8/2003 | Kenny, Jr. et al. |
| 6,609,560 B2 * | 8/2003 | Cho et al. ............... 165/104.26 |
| 6,632,655 B1 | 10/2003 | Mehta et al. |
| 6,632,719 B1 | 10/2003 | DeBoer et al. ............. 438/381 |
| 6,651,735 B2 * | 11/2003 | Cho et al. ............... 165/104.26 |
| 6,729,383 B1 | 5/2004 | Cannell et al. |
| 6,743,664 B2 | 6/2004 | Liang et al. |
| 6,775,996 B2 | 8/2004 | Cowans ....................... 62/160 |
| 2001/0016985 A1 | 8/2001 | Insley et al. |
| 2001/0024820 A1 | 9/2001 | Mastromatteo et al. |
| 2001/0045270 A1 | 11/2001 | Bhatti |
| 2001/0046703 A1 | 11/2001 | Burns et al. |
| 2002/0075645 A1 | 6/2002 | Kitano et al. |
| 2002/0096312 A1 * | 7/2002 | Korin ........................ 165/58 |
| 2002/0121105 A1 | 9/2002 | McCarthy, Jr. et al. |
| 2002/0134543 A1 | 9/2002 | Estes et al. |
| 2003/0062149 A1 | 4/2003 | Goodson et al. |
| 2003/0121274 A1 | 7/2003 | Wightman |
| 2003/0213580 A1 | 11/2003 | Philpott et al. |
| 2004/0040695 A1 | 3/2004 | Chesser et al. |
| 2004/0052049 A1 | 3/2004 | Wu et al. |
| 2004/0089008 A1 | 5/2004 | Tilton et al. |
| 2004/0125561 A1 | 7/2004 | Gwin et al. |
| 2004/0160741 A1 | 8/2004 | Moss et al. |
| 2004/0188069 A1 | 9/2004 | Tomioka et al. |

OTHER PUBLICATIONS

Angela Rasmussen et al., "Fabrication Techniques to Realize CMOS–Compatible Microfluidic Microchannels", Journal of Microelectromechanical, Vo. 10, No. 2, Jun. 2001, pp. 286–297.

J. H. Wang et al., "Thermal–Hydraulic Characteristic of Micro Heat Exchangers", 1991, DSC–vol. 32, Micromechanical Sensors, Actuators, and Systems, pp. 331–339.

Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16–23.

X. F. Peng et al., "Heat Transfer–Characteristics of Water Flowing through Microchannels", Experimental Heat Transfer An International Journal, vol. 7, No. 4, Oct.–Dec. 1994, pp. 265–283.

Linan Jiang et al., "Forced Convection Boiling in a Microchannel Heat Sink", Journal of Microelectromechanical Systems, vol. 10, No. 1, Mar. 2001, pp. 80–87.

Muhammad M. Rahman et al., "Experimental Measurements of Fluid Flow and Heat Transfer in Microchannel Cooling Passages in a Chip Substrate", 1993, EEP–vol. 4–2, Advances in Electronic Packages, pp. 685–692.

X. F. Peng et al., "Forced convection and flow boiling heat transfer for liquid flowing through Microchannels", 1993, Int. J. Heat Mass Transfer, vol. 36, No. 14, pp. 3421–3427.

Lung–Jieh Yang et al., "A Micro Fluidic System of Micro Channels with On–Site Sensors by Silicon Bulk Micromaching", Sep. 1999, Microfluidic Devices and Systems II, vol. 3877, pp. 267–272.

G. Mohiuddin Malu et al., "Heat transfer and fluid flow in microchannels", 1997, Int. J. Mass transfer, vol. 40, No. 13, pp. 3079–3088, printed in Great Britain.

J. M. Cuta et al., "Fabrication and Testing of Micro–Channel Heat Exchangers", SPIE Microlithography and Metrology in Micromaching, vol. 2640, 1995, pp. 152–160.

Linan Jiang et al., "A Micro–Channel Heat Sink with Integrated Temperature Sensors for Phase Transition Study", 1999, $12^{th}$ IEEE International Conference on Micro Electro Mechanical Systems, pp. 159–164.

Linan Jiang et al., "Fabrication and characterization of a microsystem for a micro–scale heat transfer study", J. Micromech. Microeng. 9 (1999) pp. 422–428, printed in the U.K.

M. B. Bowers et al., "High flux boiling in low flow rate, low pressure drop mini–channel and micro–channel heat sinks", 1994, Int. J. Heat Mass Transfer, vol. 37, No. 2, pp. 321–332.

Yongendra Joshi, "Heat out of small packages", Dec. 2001, Mechanical Engineer, pp. 56–58.

A. Rostami et al., "Liquid Flow and Heat Transfer in Microchannels a Review", 2000, Heat and Technology, vol. 18, No. 2, pp. 59–68.

Lian Zhang et al., "Measurements and Modeling of Two–Phase Flow in Microchannels with Nearly Constant Heat Flux Boundary Conditions", Journal of Microelectromechanical Systems, vol. 11, No. 1, Feb. 2002, pp. 12–19.

Muhammad Mustafizur Rahman, "Measurements of Heat Transfer in Microchannel Heat Sinks", Int. Comm. Heat Mass Transfer, vol. 27, No. 4, May 2000, pp. 495–506.

Issam Mudawar et al., "Enhancement of Critical Heat Flux from High Power Microelectronic Heat Sources in a Flow Channel", Journal of Electronic Packaging, Sep. 1990, vol. 112, pp. 241–248.

Nelson Kuan, "Experimental Evaluation of Micro Heat Exchangers Fabricated in Silicon", 1996, HTD–vol. 331, National Heat Transfer Conference, vol. 9, pp. 131–136.

E. W. Kreutz et al., "Simulation of micro–channel heat sinks for optoelectronic microsystems", Microelectronics Journal 31(2000) pp. 787–790.

J. C. Y. Koh et al., "Heat Transfer of Microstructure for Integrated Circuits", 1986, Int. Comm. Heat Mass Transfer, vol. 13, pp. 89–98.

Snezana Konecni et al., "Convection Cooling of Microelectronic Chips", 1992, InterSociety Conference on Thermal Phenomena, pp. 138–144.

Michael B. Kleiner et al., "High Performance Forced Air Cooling Scheme Employing Microchannel Heat Exchangers", 1995, IEEE Transactions on Components, Packaging, and Manufacturing Technology–Part A, vol. 18, No. 4, pp. 795–804.

Jerry K. Keska Ph.D. et al., "An Experimental Study on an Enhanced Microchannel Heat Sink for Microelectronics Applications", EEP–vol. 26–2, Advances in Electronic Packaging, 1999, vol. 2, pp. 1235–1259.

Shung–Wen Kang et al., "The Performance Test and Analysis of Silicon–Based Microchannel Heat Sink", Jul. 1999, Terahertz and Gigahertz Photonics, vol. 3795, pp. 259–270.

Joseph C. Tramontana, "Semiconductor Laser Body Heat Sink", Xerox Disclosure Journal, vol. 10, No. 6, Nov./Dec. 1985, pp. 379–381.

Sarah Arulanandam et al., "Liquid transport in rectangular microchannels by electroosmotic pumping", Colloid and Surfaces A: Physicochemical and Engineering Aspects 161 (2000), pp. 89–102.

Jeffery D. Barner et al., "Thermal Ink Jet Print Head Carriage with Integral Liquid Cooling Capabilities", Xerox Disclosure Journal–vol. 21, No. 1, Jan./Feb. 1996, pp. 33–34.

"Autonomous displacement of a solution in a microchannel by another solution", Research Disclosure, Jun. 2001, pp. 1046–1047.

John M. Waldvogel, "Aluminum Silicon Carbide Phase Change Heat Spreader", Motorola, Jun. 1999, Technical Developments, pp. 226–230.

James P. Slupe et al., "An idea for maintaining a stable thermal environment for electronic devices", Research Disclosure, Aug. 2001, p. 1312.

John M. Waldvogel, "A Heat Transfer Enhancement Method for Forced Convection Bonded–Fin Heatsinks", Motorola, Dec. 1997, Technical Developments, pp. 158–159.

"Thin Heat Pipe for Cooling Components on Printed Circuit Boards", IBM Technical Disclosure Bulletin, vol. 34, No. 7B, Dec. 1991 pp. 321–322.

R. C. Chu et al., "Process for Nucleate Boiling Enhancement", IBM Technical Disclosure Bulletin, vol. 18, No. 7, Dec. 1975, p. 2227.

J. Riseman, "Structure for Cooling by Nucleate Boiling", IBM Technical Disclosure Bulletin, vol. 18, No. 11, Apr. 1976, p. 3700.

"Integrally Grooved Semiconductor Chip and Heat Sink", Oct. 1971, IBM Technical Disclosure Bulletin, vol. 14, No. 5, p. 1425.

"Enhanced Cooling of Thermal Conduction Module", IBM Technical Disclosure Bulletin, vol. 30, No. 5, Oct. 1987, p. 426.

"Heat Exchanger Modules for Data Process with Valves Operated by Pressure form Cooling Water Pump", IBM Technical Disclosure Bulletin, vol. 30, No. 5, Oct. 1987, p. 419.

"Cold Plate for Thermal Conduction Module with Inlet for Cooling Water Near Highest Power Chips", IBM Technical Disclosure Bulletin, vol. 38, No. 5, Oct. 1987, p. 413.

"Circuit Module Cooling with Coaxial Bellow Providing Inlet, Outlet and Redundant Connections to Water–Cooled Element", IBM Technical Bulletin, vol. 30, No. 5, Oct. 1987, pp. 345–347.

"Piping System with Valves Controlled by Processor for Heating Circuit Modules in a Selected Temperature Profile for Scaling Integrity Test Under Temperature Stress", IBM Technical Disclosure Bulletin, vol. 30, No. 5, Oct. 1987, p. 336.

"Cooling System for Chip Carrier on Card", IBM Technical Disclosure Bulletin, vol. 31, No. 4, Sep. 1988, pp. 39–40.

"Chip Cooling Device", IBM Technical Disclosure Bulletin, vol. 30, No. 9, Feb. 1988, pp. 435–436.

W. E. Ahearn et al., "Silicon Heat Sink Method to Control Integrated Circuit Chip Operating Temperatures", IBM Technical Disclosure Bulletin, vol. 21, No. 8, Jan. 1979, pp. 3378–3380.

N. P. Bailey et al., "Cooling Device for Controlled Rectifier", IBM Technical Disclosure Bulletin, vol. 21, No. 11, Apr. 1979, pp. 4609–4610.

W. J. Kleinfelder et al., "Liquid–Filled Bellows Heat Sink", IBM Technical Disclosure Bulletin, vol. 21, No. 10, Mar. 1979, pp. 4125–4126.

R. P. Chrisfield et al., "Distributed Power/Thermal Control", IBM Technical Disclosure Bulletin, vol. 22, No. 3, Aug. 1979, pp. 1131–1132.

A. J. Arnold et al., "Heat Sink Design for Cooling Modules in a Forced Air Environment", IBM Technical Disclosure Bulletin, vol. 22, No. 6, Nov. 1979, pp. 2297–2298.

A. J. Arnold, "Structure for the Removal of Heat from an Integrated Circuit Module", IBM Technical Disclosure Bulletin, vol. 22, No. 6, Nov. 1979, pp. 2294–2296.

U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.

K. C. Gallagher et al., "Cooling System for Data Processor with Flow Restricter in Secondary Loop to Limit Bypass-Cooling Water Flow", IBM Technical Disclosure Bulletin, vol. 26, No. 5, Oct. 1983, p. 2658.

R. C. Chu et al., "Silicon Heat Sink for Semiconductor Chip", IBM Technical Disclosure Bulletin, vol. 24, No. 11A, Apr. 1982, p. 5743.

J. M. Eldridge et al., "Heat–Pipe Vapor Cooling Etched Silicon Structure", IBM Technical Disclosure Bulletin, vol. 25, No. 8, Jan. 1983, pp. 4118–4119.

J. R. Skobern, "Thermoelectrically Cooled Module", IBM Technical Disclosure Bulletin, vol. 27, No. 1A, Jun. 1984, p. 30.

M. J. Brady et al., "Etched Silicon Integrated Circuit Heat Sink", IBM Technical Disclosure Bulletin, vol. 27, No. 1B, Jun. 1984, p. 627.

H. D. Edmonds et al., "Heat Exchange Element for Semiconductor Device Cooling", IBM Technical Disclosure Bulletin, vol. 23, No. 3, Aug. 1980, p. 1057.

R. W. Noth, "Heat Transfer from Silicon Chips and Wafers", IBM Technical Disclosure Bulletin, vol. 17, No. 12, May 1975, p. 3544.

"Forced Boiling Cooling System with Jet Enhancement for Critical Heat Flux Extension", IBM Technical Disclosure Bulletin, vol. 39, No. 10, Oct. 1996, p. 143.

"Miniature Heat Exchanger for Corrosive Media", IBM Technical Disclosure Bulletin, vol. 38, No. 01, Jan. 1995, pp. 55–56.

"Self–Contained Active Heat Dissipation Device", IBM Technical Disclosure Bulletin vol. 39, No. 04, Apr. 1996, pp. 115–116.

C. J. Keller et al., "Jet Cooling Cup for Cooling Semiconductor Devices", IBM Technical Disclosure Bulletin, vol. 20, No. 9, Feb. 1978, pp. 3575–3576.

B. J. Ronkese, "Centerless Ceramic Package with Directly Connected Heat Sink", IBM Technical Disclosure Bulletin, vol. 20, No. 9, Feb. 1978, p. 3577–3578.

K. S. Sachar, "Liquid Jet Cooling of Integrated Circuit Chips", vol. 20, No. 9, Feb. 1978, pp. 3727–3728.

A. H. Johnson, "Device Cooling", IBM Technical Disclosure Bulletin, vol. 20, No. 10, Mar. 1978, pp. 3919–3920.

A. L. Pacuzzo et al., "Integrated Circuit Module Package Cooling Structure", IBM Technical Disclosure Bulletin, vol. 20, No. 10, Mar. 1978, pp. 3898–3899.

R. D. Durand et al., "Flexible Thermal Conductor for Electronic Module", IBM Technical Disclosure Bulletin, vol. 20, No. 11A, Apr. 1978, p. 4343.

D. Balderes et al., "Liquid Cooling of a Multichip Module Package", IBM Technical Disclosure Bulletin, vol. 20, No. 11A, Apr. 1978, pp. 4336–4337.

J.A. Dorler et al., "Temperature Triggerable Fluid Coupling System for cooling Semiconductor Dies", IBM Technical Disclosure Bulletin, vol. 20, No. 11A, Apr. 1978, pp. 4386–4388.

V. W. Antonetti et al., "Integrated Module Heat Exchanger", IBM Technical Disclosure Bulletin, vol. 20, No. 11A, Apr. 1978, p. 4498.

P. Hwang et al., "Conduction Cooling Module", IBM Technical Disclosure Bulletin, vol. 20, No. 11A, Apr. 1978, pp. 4334–4335.

A. J. Arnold, "Electronic Packaging Structure", IBM Technical Disclosure Bulletin, vol. 20, No. 11B, Apr. 1978, pp. 4820–4822.

V. Y. Doo et al., "High Performance Package for Memory", IBM Technical Disclosure Bulletin, vol. 21, No. 2, Jul. 1978, pp. 585–586.

"Multi–Chip Package with Cooling by a Spreader Plate in Contact with a Chip having Cylindrical Holes Mating with an Inverse Frame Providing Water Flow Within its Pins", IBM Technical Disclosure Bulletin, vol. 31, No. 5, Oct. 1988, pp. 141–142.

J. Landrock et al., "Cooling System for Semiconductor Chips", IBM Technical Disclosure Bulletin, vol. 23, No. 4, Sep. 1980, p. 1483.

E. P. Damm, Jr., "Convection Cooling Apparatus", IBM Technical Disclosure Bulletin, vol. 20, No. 7, Dec. 1977, pp. 2755–2756.

"Circuit Package with Circulating Boiling Liquid and Local Heat Exchanger to Limit Vapor in Coolant Outlet", IBM Technical Disclosure Bulletin, vol. 31, No. 12 May 1989, p. 34.

"Circuit Module Cooling with Multiple Pistons Contacting a Heat Spreader/Electrical Buffer Plate in Contact with Chip", IBM Technical Disclosure Bulletin, vol. 31, No. 12, May 1989, p. 5–7.

"TCM–LIKE Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, pp. 305–306.

"Water–Cooled Circuit Module with Grooves Forming Water Passages Near Heat–Producing Devices", IBM Technical Disclosure Bulletin, vol. 31, No. 12, May 1989, pp. 49–50.

"Cold Plate for Thermal conduction Module with Only Peripheral Mounting bolts, Large Surface Area Fin Inserts and Reduced Water Flow and Thermal Resistances", IBM Technical Disclosure Bulletin, vol. 31, No. 12, May 1989, p. 59.

"Thermal Control Hardware for Accelerated Run–In Testing of Multi–Chip Modules", IBM Technical Disclosure Bulletin, vol. 32, No. 5A, Oct. 1989, p. 129–130.

"Means of Removing More Heart From a TCM (Or Other Liquid–Cooled Logic Package) By Reducing the Coolant Temperature", IBM Technical Disclosure Bulletin, vol. 32 No. 5A, Oct. 1989, pp. 153–154.

E. G. Loeffel et al., "Liquid Cooled Module with Compliant Membrane", IBM Technical Disclosure Bulletin, vol. 20, No. 2, Jul. 1977, pp. 673–674.

V. Y. Doo et al., "Method of Effective Cooling of a High Power Silicon Chip", IBM Technical Disclosure Buleltin, vol. 20, No. 4, Sep. 1977, p. 1436–1437.

V. Y. Doo et al., Semiconductor Chip Cooling Package, IBM Technical Disclosure Bulletin, vol. 20, No. 4, Sep. 1977, pp. 1440–1441.

"Heat Sink Fabrication Method", IBM Technical Disclosure Bulletin, vol. 27, No. 10A, Mar. 1985, p. 5656–5657.

"Thermal Conduction Module with Liquid Dielectric and Pistons with Surface Treatment for Enhanced Nucleate Boiling", IBM Technical Disclosure Bulletin, vol. 27, No. 12, May 1985, p. 6904.

"Pin Fin Array Heat Pipe Apparatus", IBM Technical Disclosure Bulletin, vol. 37, No. 09, Sep. 1994, p. 171.

Youngcheol Joo et al., "Fabrication of Monolithic Microchannels for IC Chip Cooling", 1995, IEEE Micro Electro Mechanical Systems, pp. 362–367.

Haim H. Bau, *Optimization of conduits' shape in micro heat exchangers,* Dec. 10, 1997, International Journal of Heat and Mass Transfer 41 (1998), pp. 2717–2723.

V. K. Dwivedi et al., *Fabrication of very smooth walls and bottoms of silicon microchannels for heat dissipation of semiconductor devices,* Jan. 25, 2000, Microelectronics Journal 31 (2000), pp. 405–410.

Meint J. de Boer et al., *Micromachining of Buried Micro Channels in Silicon,* Mar. 2000, Journal of Microelectromechanical systems, vol. 9, No. 1, pp. 94–103.

S. F. Choquette, M. Faghri et al., *Optimum Design of Microchannel Heat Sinks,* 1996, DSC–vol. 59, Microelectromechanical Systems (MEMS), ASME 1996, pp. 115–126.

David Copeland et al., *Manifold Microchannel Heat Sinks: Theory and Experiment,* 1995, EEP–vol. 10–2, Advances in Electronic Packaging ASME 1995, pp. 829–835.

J. M. Cuta et al., *Forced Convection Heat Transfer in Parallel Channel Array Microchannel Heat Exchanger,* 1996, PID–vol. 27 HTD–vol. 338, Advances in Energy efficiency, Heat/Mass Transfer Enhancement, ASME 1996, pp. 17–23.

K. Fushinobu et al., *Heat Generation and Transport in Sub–Micron Semiconductor Devices,* 1993, HTD–vol. 253, Heat Transfer on the Microscale, ASME 1993, pp. 21–28.

Charlotte Gillot et al., *Integrated Micro Heat Sink for Power Multichip Module,* Sep. 3, 1999, IEEE Transactions on Industry Applications, vol. 36. No. 1, Jan./Feb. 2000, pp. 217–221.

John Gooding, *Microchannel heat exchangers—a review,* SPIE vol. 1997 High Heat Flux Engineering II (1993), pp. 66–82.

Koichiro Kawano et al., *Micro Channel Heat Exhanger for Cooling Electrical Equipment*, HTD–vol. 361–3/PID–vol. 3, Proceedings of the ASME Heat Transfer Division—vol. 3, ASME 1998, pp. 173–188.

Chad Harris et al., *Design and Fabrication of a Cross Flow Micro Heat Exchanger*, Dec. 2000, Journal of Microelectromechanical Systems, vol. 9, No. 4, pp. 502–508.

George M. Harpole et al., *Micro–Channel Heat Exchanger Optimization*, 1991, Seventh IEEE SEMI–THERM Symposium, pp. 59–63.

Pei–Xue Jiang et al., *Thermal–hydraulic performance of small scale micro–channel and prous–media heat–exchangers*, 2001, International Journal of Heat and Mass Transfer 44 (2001), pp. 1039–1051.

X.N. Jiang et al., *Laminar Flow Through Microchannels Used for Microscale Cooling Systems*, 1997, IEEE/CPMT Electronic Packaging Technology Conference, pp. 119–122, Singapore.

David Bazeley Tuckerman, *Heat–Transfer Microstructures for Integrated Circuits*, Feb. 1984, pp. ii–xix, pp. 1–141.

M Esashi, *Silicon micromachining for integrated microsystems*, 1996, Vacuum/vol. 47/Nos. 6–8/pp. 469–474.

T.S. Raviguruajan et al., *Effects of Heat Flux on Two–Phase Flow characteristics of Refrigerant Flows in a Micro–Channel Heat Exchanger*, HTD–vol. 329, National Heat Transfer Conference, vol. 7, ASME 1996, pp. 167–178.

T.S. Ravigruruajan et al., *Single–Phase Flow Thermal Performance Characteristics of a Parallel Micro–Channel Heat Exchanger*, 1996, HTD–vol. 329, National Heat Transfer Conference, vol. 7, ASME 1996, pp. 157–166.

T.S. Ravigururajan et al., *Liquid Flow Characteristics in a Diamond–Pattern Micro–Heat–Exchanger*, DSC–vol. 59 Microelectromechanical Systems (IMEMS), ASME 1996, pp. 159–166.

T.S. Raviguruajan, *Impact of Channel Geometry on Two–Phase Flow Heat Transfer Characteristics of Refrigerants in Microchannel Heat Exchangers*, May 1998, Journal of Heat Transfer, vol. 120, pp. 485–491.

J. Pfahler et al., *Liquid Transport in Micron and Submicron Channels*, Mar. 1990, Sensors and Actuators, A21–A23 (1990), pp. 431–434.

Kenneth Pettigrew et al., *Performance of a MEMS based Micro Capillary Pumped Loop for Chip–Level Temperature Control*, 2001, The 14$^{th}$ IEEE International Conference on Micro Electro Mechanical Systems, pp. 427–430.

C. Perret et al., *Microchannel integrated heat sinks in silicon technology*, Oct. 12–15, 1998, The 1998 IEEE Industry Applications Conference, pp. 1051–1055.

X.F. Peng et al., *Convective heat transfer and flow friction for water flow in microchannel structures*, 1996, Int. J. Heat Mass Transfer, vol. 39, No. 12, pp. 2599–2608, printed in Great Britain.

X.F. Peng et al., *Experimental investigation of heat transfer in flat plates with rectangular microchannels*, 1994, Int. J. Heat Mass Transfer, vol. 38, No. 1, pp. 127–137, printed in Great Britain.

X.F. Peng et al., *Cooling Characteristics with Microchanneled Structures*, 1994, Enhanced Heat Transfer, vol. 1, No. 4, pp. 315–326, printed in the United States of America.

X.F. Peng et al., *Enhancing the Critical Heat Flux Using Microchanneled Surfaces*, 1998, Enhanced Heat Transfer, vol. 5, pp. 165–176, Printed in India.

Yoichi Murakami et al., *Parametric Optimization of Multichanneled Heat Sinks for VLSI Chip Cooling*. Mar. 2002, IEEE Transactions on Components and Packaging Technologies, vol. 24, No. 1, pp. 2–9.

M.J. Marongiu et al., *Enhancement of Multichip Modules (MCMs) Cooling by Incorporating MicroHeatPipes and Other High Thermal Conductivity Materials into Microchannel Heat Sinks*, 1998, Electronic Components and Technology Conference, pp. 45–50.

C.R. Friedrich et al., *Micro heat exchangers fabricated by diamond machining*, Jan. 1994, Precision Engineering, vol. 16, No. 1, pp. 56–59.

Mali Mahalingam, *Thermal Management in Semiconductor Devices Packaging*, 1985, Proceedings of the IEEE, vol. 73, No. 9, Sep. 1985, pp. 1396–1404.

T.M. Adams et al., *An experimental investigation of single-phase forced convection in microchannels*, 1997, Int. J. Heat Mass Transfer, vol. 41, Nos. 6–7, pp. 851–857, Printed in Great Britain.

Bassam Badran et al. *Experimental Results for Low–Temperature Silicon Micromachined Micro Heat Pipe Arrays Using Water and Methanol as Working Fluids*, May 31, 1997, Experimental Heat Transfer, 10: pp. 253–272.

D. Jed Harrison et al., *Electroosmotic Pumping Within A Chemical Sensor System Integrated on Silicon*, Session C9 Chemical Sensors and Systems for Liquids, Jun. 26, 1991, pp. 792–795.

Gh. Mohiuddin Mala et al., *Flow characteristics of water through a microchannel between two parallel plates with electrokinetic effects*, 1997, Int. J. Heat and Fluid Flow, vol. 18, No. 5, pp. 489–496.

Stephanus Buttgenbach et al., *Microflow devices for miniaturized chemical analysis systems*, Nov. 4–5, 1998, SPIE–Chemical Microsensors and Applications, vol. 3539, pp. 51–61.

Sarah Arunlanandam et al., *Liquid transport in rectangular microchannels by electroosmotic pumping*, 2000, Colloids and Surfaces A: Physicochemical and Engineering Aspects vol. 161 (2000), pp. 89–102.

Susan L. R. Barker et al., *Fabrication, Derivatization and Applications of Plastic Microfluidic Devices*, Proceedings of SPIE, vol. 4205. Nov. 5–8, 2000, pp. 112–118.

Timothy E. McKnight et al., *Electroosmotically Induced Hydraulic Pumping with Integrated Electrodes on Microfluidic Devices*, 2001, Anal. Chem., vol. 73, pp. 4045–4049.

Chris Bourne, *Cool Chips plc Receives Nanotech Manufacturing Patent*, Jul. 31, 2002, pp. 1–2.

A. Manz et al., *Integrated Electroosmotic Pumps and Flow Manifolds for Total Chemical Analysis System*, 1991, Inter. Conf. on Solid–State Sensors and Actuators, pp. 939–941.

Ray Beach et al., *Modular Microchannel Cooled Heatsinks for High Average Power Laser Diode Arrays*, Apr. 1992, IEEE Journal of Quantum Electronics, vol. 28, No. 4, pp. 966–976.

Roy W. Knight et al., *Optimal Thermal Design of Air cooled Forced Convection finned Heat Sinks—Experimental Verification*, Oct. 1992, IEEE Transactions on Components, Hybrids, and Manufacturing Technology, vol. 15, No. 5 pp. 754–760.

Xiaoqing Yin et al., *Micro Heat Exchangers Consisting of Pin Arrays*, 1997, Journal of Electronic Packaging Mar. 1997, vol. 119, pp. 51–57.

X. Yin et al., *Uniform Channel Micro Heat Exchangers,* 1997, Journal of Electronic Packaging Jun. 1997, vol. 119, No. 2, pp. 89–94.

Chun Yang et al., *Modeling forced liquid convection in rectangular microchannels with electrokinetic effect,* 1998, International Journal of Heat and Mass Transfer 41 (1998), pp. 4229–4249.

Arel Weisberg et al., *Analysis of microchannels for integrated cooling,* 1992, Int. J. Heat Mass Transfer, vol. 35, No. 10, pp. 2465–2473.

Roger S. Stanley et al., *Two–Phase Flow in Microchannels,* 1997, DSE–vol. 62/HTD–vol. 354, MEMS, pp. 143–152.

B. X. Wang et al., *Experimental investigation on liquid forced–convection heat transfer through microchannels,* 1994, Int. J. Heat Mass Transfer, vol. 37, Suppl. 1, pp. 73–82.

Kambiz Vafai et al., *Analysis of two–layered micro–channel heat sink concept in electronic cooling,* 1999, Int. J. Heat Mass Transfer, 42 (1999), pp. 2287–2297.

Gokturk Tune et al., *Heat transfer in rectangular microchannels,* 2002, Int. J. Heat Mass Transfer, 45 (2002), pp. 765–773.

D. B. Tuckerman et al., *High–Performance Heat Sinking for VLSI,* 1981, IEEE Electron Device Letters, vol. EDL–2, No. 5, pp. 126–129.

Bengt Sunden et al., *An Overview of Fabrication Methods and Fluid Flow and Heat Transfer Characteristics of Micro Channels,* pp. 3–23.

David S. Shen et al., *Micro Heat Spreader Enhance Heat Transfer in MCMs* 1995, IEEE Multi–Chip Module Conference, pp. 189–194.

S. Sasaki et al., *Optimal Structure for Microgrooved Cooling Fin for High–Power LSI Devices,* Electronic Letters, Dec. 4, 1986, vol. 22, No. 25.

Vijay K. Samalam, *Convective Heat Transfer in Microchannels,* Sep. 1989, Journal of Electronic Materials, vol. 18, No. 5, pp. 611–617.

Sanjay K. Roy et al., *A Very High Heat Flux Microchannel Heat Exchanger for Cooling of Semiconductor Laser Diode Arrays,* 1996, IEEE Transactions on components, packaging, and manufacturing technology–part B, vol. 19, No. 2, pp. 444–451.

Charlotte Gillot et al., *Integrated Single and Two–Phase Micro Heat Sinks Under IGBT Chips,* IEEE Transactions on Components and Packaging Technology, vol. 22 No. 3, Sep. 1999, pp. 384–389.

H. Krumm "Chip Cooling", IBM Technical Disclosure Bulletin, vol. 20, No. 7, Dec. 1977, p. 2728.

Jae–Mo Koo et al., "Modeling of Two–Phase Microchannel Heat Sinks for VLSI Chips", Mech. Eng. Depart. of Stanford University, pp. 422–426.

"*Closed Loop Electroosmotic Microchannel Cooling System for VLSI Circuits*", Linan Jang et al., Department of Mechanical Engineering, Stanford University, pages 1–27.

"*Modeling of Two–Phase Microchannel Heat Sinks for VSLI Chips*", Jae–Mo Koo et al., Mechanical Engineering Department, Stanford CA. 94305–3030 pages 422–426.

\* cited by examiner

Liquid Flow

Liquid Flow

US 6,994,151 B2

VAPOR ESCAPE MICROCHANNEL HEAT EXCHANGER

RELATED APPLICATIONS

This Patent Application claims priority under 35 U.S.C. 119 (e) of the co-pending U.S. Provisional Patent Application, Ser. No. 60/420,557 filed Oct. 22, 2002, and entitled "VAPOR ESCAPE MICROCHANNEL HEAT EXCHANGER WITH SELF ATTACHMENT MEANS". The Provisional Patent Application, Ser. No. 60/420,557 filed Oct. 22, 2002, and entitled "VAPOR ESCAPE MICROCHANNEL HEAT EXCHANGER WITH SELF ATTACHMENT MEANS" is also hereby incorporated by reference.

FIELD OF THE INVENTION

The present invention relates to cooling of a heat producing device using a heat exchanger, in general, and in particular, a vapor escape membrane coupled to a heat exchanger and a method of providing the same.

BACKGROUND OF THE INVENTION

A variety of devices and applications are present which require cooling of devices that have very high heat fluxes, such as in the range of 100–1000 W/cm$^2$. These devices include integrated electronic circuits in microprocessors, laser diodes, and power semiconductor devices for control electronics. There have been many solution strategies for cooling these devices.

One solution strategy for cooling a device emitting high heat fluxes include utilizing a heat pipe 10 having a vapor chamber 12, as shown in FIG. 1A. The heat pipe 10 includes a wick structure 14 which draws liquid to the heat source 99 by the use of capillary forces. In particular, as shown in FIG. 1A, the liquid evaporates in the wick 14 when heated and the resulting vapor escapes to the center of the heat pipe 10 where it is propelled to cooler regions for condensation. However, a problem with the geometry of the heat pipe 10 is that the flowrate of the liquid is limited by the capillary pressure available for drawing liquid back into the wick 14. One way to increase the flowrate of liquid through the heat pipe 10, is to make the wick structure 14 thicker. However, thickening the wick structure 14 increases the heat transfer resistance for conduction normal to the wick structure 14 itself, thereby rendering the wick 14 less effective. The temperature rise between the heat inlet and the heat exchange interface would increase if a thickened wick 14 is used, thereby making the heat pipe 10 less effective.

Another solution strategy for cooling the high heat fluxes in the devices is using a microchannel heat sink 20 coupled to a pump 22 and a heat rejector 26, as shown in FIG. 1B. This approach in FIG. 1B achieves a much higher liquid flowrate per unit volume than heat pipes 10 (FIG. 1A) due to the presence of the pump. This approach increases the heat removal capacity of the heat sink 20 without increasing the system volume. The heat transfer resistance remains low, because the resistance is governed by the small hydraulic diameter and large surface-to-volume ratio of the microchannels 24 in the heat sink 20, which remains the same. Microchannel heat sinks 20 with two-phase boiling convection achieve high rates of cooling with relatively low flowrates through evaporation of the fluid.

However, a major problem with cooling a device using these two-phase microchannel heat exchangers is the large pressure gradients that occur along the channels when the liquid begins to boil. It is known that the vapor phase of a substance is much less dense than that of the substance in liquid form. Therefore, for a given pumping power, the vapor phase of the substance will accelerate through a channel by up to a factor of a 1000 times. The acceleration and the resulting shear forces of the vapor substance through the channel dramatically increases the pressure drop along the channel. The large pressure drop in the channel thereby causes two-phase unsteady flow instabilities along the channel. These instabilities are assisted with bubbles forming in the flow and large drag forces being produced due to the small dimensions of the channels. The large pressure drop also greatly increases the amount of power required to pump the liquid through the microchannel heat sink 20. In effect, the microchannel requires more pumping power to cool a device 99, because the boiling of the liquid causes a very large increase in volume flow rate and a large pressure drop within the microchannel heat sink 20.

What is needed is a device which offers high flowrate capabilities, low thermal resistance and volume as well as has a phase separation capability in the heat exchanger which minimizes the pressure drop created by the phase change of the cooling liquid.

SUMMARY OF THE INVENTION

In one aspect of the invention, a microchannel heat exchanger comprises means for channeling a fluid in a liquid state along a heat exchange interface, whereby vapor is produced within the means for channeling. The heat exchanger also comprises means for removing the vapor from the means for channeling. The means for removing is operatively coupled to the means for channeling such that substantially all of the fluid in the liquid state is retained along the heat exchange interface and the vapor is removed from the means for channeling. The microchannel heat exchanger further comprises means for collecting the vapor that passes through the means for removing, whereby vapor within the means for collecting exits through a vapor outlet. The means for removing is preferably positioned above the channeling means.

In another aspect of the invention, a microchannel heat exchanger is coupled to a heat producing device. The heat exchanger also comprises a first chamber for channeling liquid from a first port. The liquid is channeled along a surface that is configured to transfer heat between the heat exchanger and the heat producing device. The heat exchanger also comprises a second chamber which collects vapor that is produced from the heated liquid that is within the first chamber. The second chamber outputs the vapor collected through a third port. The heat exchanger also comprises a porous membrane which passes vapor from the first chamber to the second chamber. The porous membrane is positioned between the first chamber and the second chamber and is configured to substantially retain the liquid within the first chamber. The microchannel heat exchanger further comprises a second port that is coupled to the first chamber, wherein heated liquid exits the second port. The porous membrane is operatively coupled to the first chamber. The liquid enters the first port at a first temperature and exits the second port at a second temperature. The surface of the first chamber includes an array of channels positioned in a predetermined pattern, wherein one channel in the array alternatively has at least one dimension dissimilar to an adjacent channel. The microchannel heat exchanger alternatively has at least one channel which includes a channel aperture that passes the liquid to an adjacent channel. The surface is alternatively roughened. Alternatively, the first chamber further comprises an array of pillars that are configured in a predetermined pattern. The porous membrane further comprises a plurality of apertures which allow vapor to pass through, whereby the apertures have a predetermined dimension.

In yet another aspect, a microchannel heat exchanger comprises a first port for receiving liquid that has a first temperature. The heat exchanger also comprises a heat transferring element which channels the liquid from the first port along an interface, wherein the liquid generates vapor while flowing along the interface. The heat exchanger also comprises a membrane for separating vapor from the liquid. The membrane is configured to transfer the vapor to a separate element and confine the liquid to the interface, whereby a majority of vapor exits through a second port in the separate element. The microchannel heat exchanger further comprises a third port that is coupled to the heat transferring element. The third port allows liquid to exit, whereby the liquid has a second temperature which is higher than the first temperature. The heat transferring element further comprises an array of channels that are positioned in a predetermined pattern, whereby at least one channel in the array alternatively has a dimension different than an adjacent channel. Alternatively, at least one channel further comprises a channel aperture that passes the liquid to an adjacent channel. In another embodiment, the interface is roughened. The first chamber alternatively comprises an array of pillars that are configured in a predetermined pattern. The membrane further comprises a plurality of apertures which allow vapor to transfer therethrough, whereby each of the apertures has a predetermined dimension.

Another aspect of the invention includes a closed circulation loop for cooling a heat producing device. The loop comprises a heat exchanging element that is in contact with the heat producing device. The heat exchanging element further comprises a first element which channels a liquid along a heat transfer region, wherein the liquid enters the first element through a first port at a first temperature. The heat exchanging element also further comprises a vapor permeable membrane that is coupled to the first element. The vapor permeable membrane is configured to transfer vapor that is produced in the first element to a second port. The vapor permeable membrane confines the liquid within the first element. The loop also comprises a heat rejector which cools vapor received from the second port to the first temperature to produce the liquid. The heat rejector is coupled to the first port and is configured to provide the first temperature liquid to the heat exchanging element. The heat exchanging element preferably further comprises a third port that is coupled to the first element, whereby liquid which has a second temperature is confined within the first element and flows to the heat rejector through the third port. The heat rejector preferably receives the liquid from the third port, wherein the heat rejector cools the liquid from the second temperature to the first temperature. The circulation loop further comprises a second element coupled to the second port. The second element holds vapor that is transferred through the vapor permeable membrane, whereby the second element is configured to induce vapor to transfer thereto. The circulation loop further comprises at least one pump that is coupled to the heat rejector. The pump pumps the liquid from the rejector to the heat exchanging element at an appropriate flowrate to cool the heat producing device. The pump includes, but is not limited to different types of pumps, such as a microchannel electroosmotic pump, a hydraulic pump, and a capillary pump which has a wicking structure positioned along the heat transfer interface. The heat rejector is alternatively positioned at a first height in the loop above the heat exchanging element, wherein the liquid flows to the heat exchanging element using gravitational forces. The capillary pump alternatively comprises a thermosyphon pump that utilizes the gravitational forces to pump the liquid to the heat exchanging element.

In yet another aspect of the invention, a vapor escape membrane for use in a heat exchanging device, whereby the heat exchanging device runs liquid into a cooling region that is positioned adjacent to the heat producing device. The vapor escape membrane comprises a porous surface which removes vapor produced from the liquid in the cooling region. The membrane is configured to confine the liquid only within the cooling region. The vapor escape membrane transfers vapor to a vapor region within the heat exchanging device, whereby the membrane is configured to prevent liquid in the cooling region from entering the vapor region. The vapor escape membrane is configured to include a hydrophobic surface between the membrane and the cooling region, wherein the liquid in the cooling region does not flow through the porous surface. The heat exchanging device alternatively comprises a heat pipe configuration which has a wick structure positioned within the cooling region. The heat exchanging device preferably comprises a heat sink that has a plurality of microchannels that are configured in a predetermined pattern in the cooling region. The vapor escape membrane further comprises a plurality of apertures which allow vapor to transfer therethrough, whereby each of the apertures have a predetermined dimension.

In yet another aspect of the invention, a method of assembling a microchannel heat exchanger which cools a heat producing device. The method comprises providing a liquid chamber which has a surface that is configurable to be placed adjacent to the heat producing device. The method comprises coupling a vapor chamber to the liquid chamber, wherein the vapor chamber is configured above the liquid chamber. The method comprises configuring a vapor permeable membrane between the vapor chamber and the liquid chamber, whereby the vapor permeable membrane is operatively coupled to the liquid chamber such that only vapor that is produced with the liquid chamber flows to the vapor chamber. The method further comprises coupling an inlet port to the liquid chamber, whereby the inlet port is configured to provide liquid that has a first temperature to the microchannel heat exchanger. The method further comprises patterning the surface of the liquid chamber into a desired configuration. The method also further comprises coupling an outlet port to the liquid chamber, whereby the outlet port is configured to exit liquid having a second temperature from the microchannel heat exchanger. The method further comprises coupling an outlet port to the vapor chamber, whereby the outlet port is configured to remove vapor that is present within the vapor chamber.

Other features and advantages of the present invention will become apparent after reviewing the detailed description of the preferred embodiments set forth below.

DETAILED DESCRIPTION OF THE PREFERRED EMBODIMENT

Reference will now be made in detail to the preferred and alternative embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it should be noted that the present invention may be practiced without these specific details. In other instances, well known methods, procedures and components have not been described in detail as not to unnecessarily obscure aspects of the present invention.

Cooling of a device having a high heat flux can be achieved using two-phase boiling convection in a microchannel heat exchanger of the present invention. As stated above with respect to existing cooling solutions, the acceleration of the vapor phase and the additional drag forces caused by the mixed phases yield large pressure drops within the heat exchanger. This large pressure drop requires pumping the fluid at a higher flowrate to ensure that the liquid adequately cools or heats up the heat producing device. It should be apparent to one skilled in the art that although the present description is directed to cooling a heat producing device, it is contemplated that the present apparatus and system can be used to refrigerate or heat up a heat producing device which is initially cold.

To overcome these problems, the present invention is directed to a vapor-permeable membrane for providing vapor escape capabilities to a heat exchanger including, but not limited to, a heat pipe or microchannel heat sink. The membrane 112 of the present invention keeps the liquid in close contact with the heated surface but removes the vapor portion produced by the boiling of the liquid flow. This removal of vapor minimizes the pressure drop along the channels. Minimizing the pressure drop thereby enables a pump to operate at lower pressures and power to provide adequate flow of liquid to achieve desired cooling of the heat producing device 99.

Figure 1A:
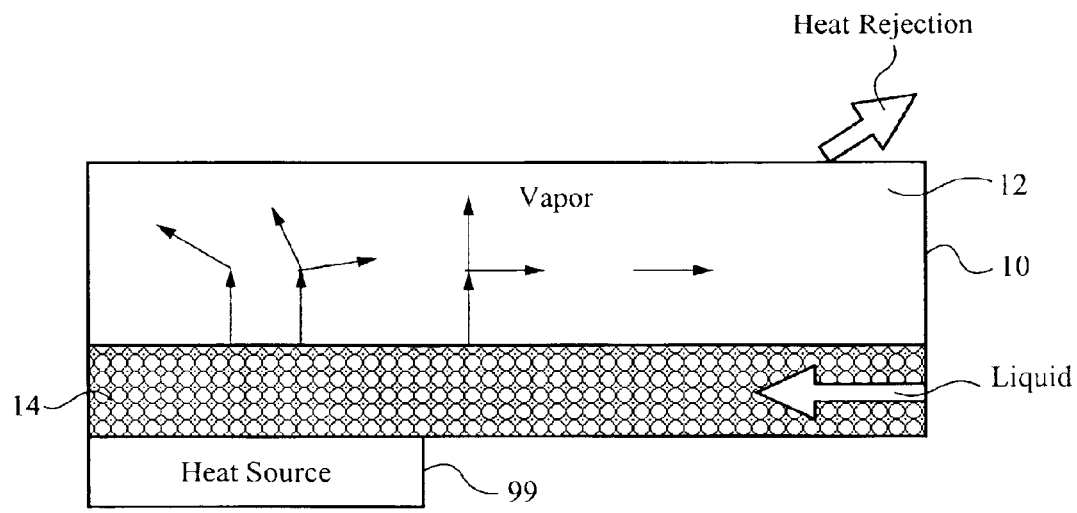
FIG. 1A illustrates a schematic drawing of an existing heat pipe including the wick structure for the liquid and the vapor region.
Figure 1B:
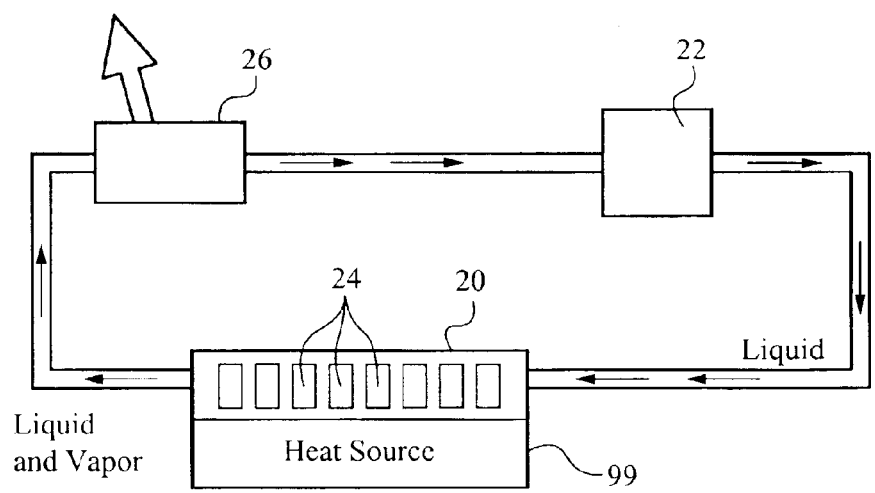
FIG. 1B illustrates a schematic drawing of an existing microchannel cooling loop including the pump and the thin channel region for the fluid.
Figure 2A:
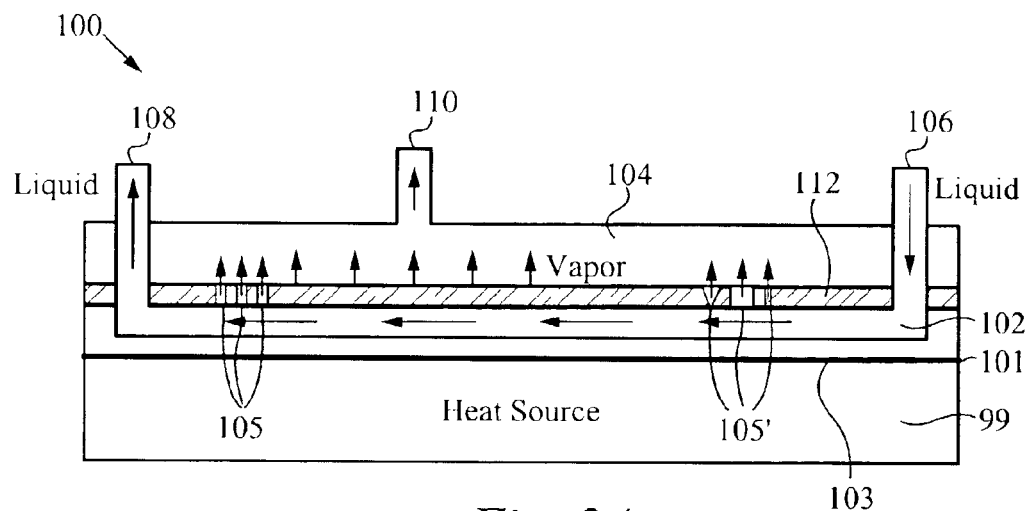
FIG. 2A illustrates a schematic drawing of a preferred embodiment of a heat exchanger in accordance with the present invention.

FIG. 2A illustrates a schematic drawing of a preferred embodiment of the heat exchanger 100 in accordance with the present invention. A microchannel heat exchanger is shown with the membrane 112 of the present invention for exemplary purposes. It should be noted that the membrane 112 can alternatively be used with heat pipes (FIG. 2B) or any other appropriate heat exchanging device known in the art. The heat exchanger 100 preferably includes a liquid chamber 102, a vapor chamber 104, an inlet port 106, a liquid outlet port 108 and a vapor outlet port 110. In addition, the heat exchanger 100 includes a vapor permeable membrane 112 configured between the liquid chamber 102 and the vapor chamber 104. As shown in FIG. 2A, the heat exchanger 100 is coupled to a heat source or heat producing device 99, such as a microprocessor. Alternatively, other heat sources, including but not limited to integrated circuits, laser diodes, and semiconductors can be used with the heat exchanger 100. In addition, the source may alternatively be a cold device initially at or near zero degrees which is heated up by the liquid.

Preferably the heat exchanger 100 is coupled to the heat source 99 using a standard die attach or thermal interface material 101 including, but not limited to thermal grease, phase-change attachment, and eutectic. Alternatively, the heat exchanger 100 is integrally formed onto or within the device 99 by directly fabricating the channels on a surface of the heat source device 99. Further, the heat exchanger 100 is alternatively coupled to the heat source using the self attach method described and disclosed in copending patent application Ser. No. 10/366,122 filed Feb. 12, 2003 and entitled "SELF ATTACHING HEAT EXCHANGER AND METHOD THEREOF" which is hereby incorporated by reference.

As stated above, the heat exchanger 100 is coupled to the heat source 99, whereby heat travels from the heat source 99 up through the attaching material 101 to the heat exchanging interface 103 of the heat exchanger 100. The heat exchanging interface 103 is preferably the interior bottom surface of the heat exchanger 100. As shown in FIG. 2, the cooling or working liquid, preferably water, enters the heat exchanger 100 at the inlet port 106 and travels along the channel configuration in the interface 103 within the liquid chamber 102. As the liquid travels along the channeled configuration of the heat exchanger 100, it is heated and eventually boils, thereby producing vapor within the liquid chamber 102.

The boiling point of the liquid flowing through the apparatus and the system can be controlled by the type of liquid as well as the pressure at which the apparatus and/or system operates. Regarding the type of liquid used, it should be apparent to one skilled in the art that other working fluids are contemplated including, but not limited to, water having ionic buffers or other additives, acetone, acetonitrile, methanol, alcohol, as well as mixtures thereof. It should also be apparent that other liquids are alternatively used which are appropriate in operating the present apparatus and system.

In the preferred embodiment, the heated liquid exits the heat exchanger 100 through the liquid outlet port 108 at a raised temperature. Alternatively, for an application in which an initially cold heat producing device is warmed up, the liquid exits the heat exchanger through the liquid port 108 at a lower temperature. In an alternative embodiment, the heat exchanger 100 does not include a liquid outlet port 108, whereby only vapor exits from the heat exchanger 100. In another alternative embodiment, the heat exchanger 100 includes multiple liquid outlet ports 108. Depending on the effectiveness of the membrane 112 in removing vapor from the liquid chamber 102, a small amount of vapor is alternatively mixed with the liquid when the liquid exits through the liquid outlet port 108. However, it should be noted that a small amount vapor mixed with the liquid still reap substantial benefits to the performance of the heat exchanger 100 in terms of reduced pump pressure drop and decreased thermal resistance.

Figure 2B:
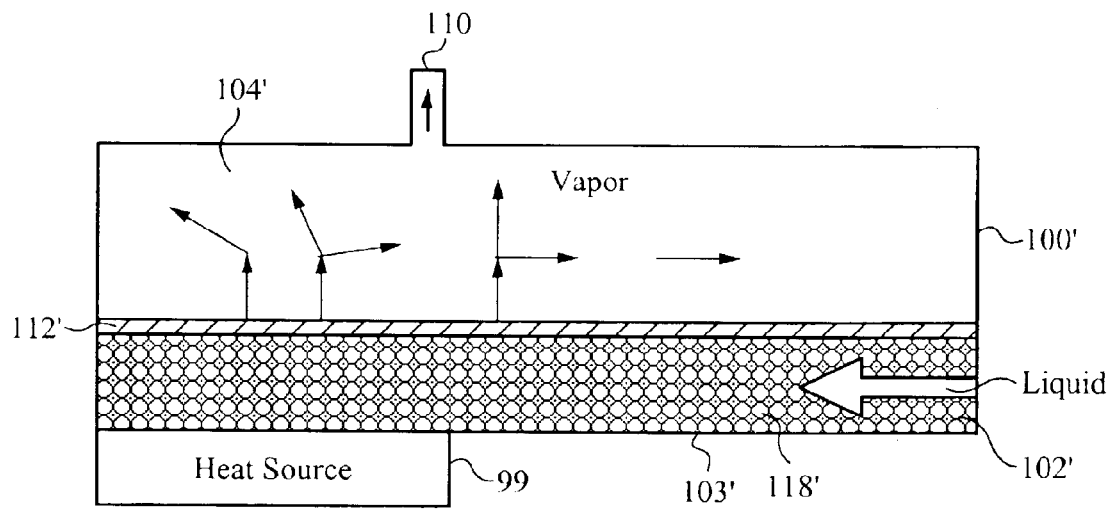
FIG. 2B illustrates a schematic drawing of an alternative embodiment of a heat exchanger in accordance with the present invention.

The membrane 112 is preferably configured above the liquid chamber 102 and has several small apertures 105 which allow the vapor in the liquid chamber to transfer to the vapor chamber 104 (FIGS. 2A–2B). Alternatively, the membrane 112 is positioned below or adjacent to the liquid chamber 102. The diameter of the pores range between 0.01–50.00 microns. However, the preferred range of the pore diameters is 0.05–10.00 microns although other pore diameters are apparent to one skilled in the art. Preferably, the apertures 105 have the same vertical and diametrical dimensions. The membrane 112 alternatively has apertures 105 that have vertical and diametrical dimensions which are variable. In addition, alternatively a portion of the apertures 105 in the membrane 112 have the same dimension, whereas another portion of the apertures 105 in the membrane have varying dimensions. In addition, the membrane 112 is configured to provide a seal between the liquid chamber 102 and the vapor chamber 104, whereby liquid within the liquid chamber 102 does not enter the vapor chamber 104 from the liquid chamber 102. Thus, the membrane 112 is preferably porous as well as hydrophobic, such that vapor passes through the membrane 112 without allowing liquid to clog or restrict the pores.

The membrane 112 removes the vapor generated from the heated liquid within the liquid chamber 102, whereby the vapor passes or transfers through the apertures of the membrane 112. The transferred vapor is collected within the vapor chamber 104 and flows out the vapor outlet 110 of the heat exchanger 100. Alternatively, the vapor chamber 104 includes more than one vapor outlet 110. Preferably the vapor chamber 104 has less pressure within than the liquid chamber 102. Therefore, the pressure differential between the two chambers causes the vapor within the liquid chamber 102 to automatically pass through the membrane 112 into the vapor chamber 104. The vapor chamber 104 contains less pressure than the liquid chamber 102 preferably due to the vapor outlet port 110 allowing vapor to freely exit the chamber 104. Alternatively, the vapor chamber 104 contains less pressure due to a suction force being applied through the vapor outlet port 110. In addition, the hydrophobicity of the membrane 112 tends to attract the vapor toward the membrane 112 into the vapor chamber 104. The vapor membrane 112 is preferably made of a hydrophobic material which allows the transfer of vapor while fully repelling liquid. For example, GORTEX® is preferably used as the membrane 112. Alternatively, other materials include, but are not limited to, PTFE, TEFLON® coated metal, micromachined Silicon, Versapor® or any other copolymers and nylons. Nonetheless, any other material is contemplated which provides the structural support and has the porous characteristics to operate the heat exchanger in accordance with the present invention. The sizes of the pores within the membrane 112 are sufficiently enough to remove as much vapor as possible from the liquid chamber 102 but also sufficiently small to prevent the actual liquid from passing into the vapor chamber 104.

The membrane 112 is preferably coupled to the heat exchanger 100 to provide a sealable engagement between the liquid chamber 102 and the vapor chamber 104. The sealable engagement between the liquid chamber 102 and the vapor chamber 104 prevents liquid from penetrating the membrane 112 at any point. However, despite the sealable engagement, the porous characteristics of the membrane 112 allow vapor from the liquid chamber 102 to pass through the membrane 112 into the vapor chamber 104. The membrane is coupled to the interior of the heat exchanger using conventional methods, including but not limited to heat sealing, sonic welding, adhesives, such as epoxy, or any mechanical means.

The membrane 112 of the present invention is alternatively utilized in existing heat exchangers to improve the performance of the heat exchangers. It should be noted that the heat exchangers include, but are not limited to, heat pipes, heat sinks, capillary loops and thermosyphons. For example, a heat pipe 100' (FIG. 2B) is alternatively modified to include the vapor-permeable membrane 112 to aid with phase separation and overcome the capillary limit to the heat flux performance.

Figure 4:
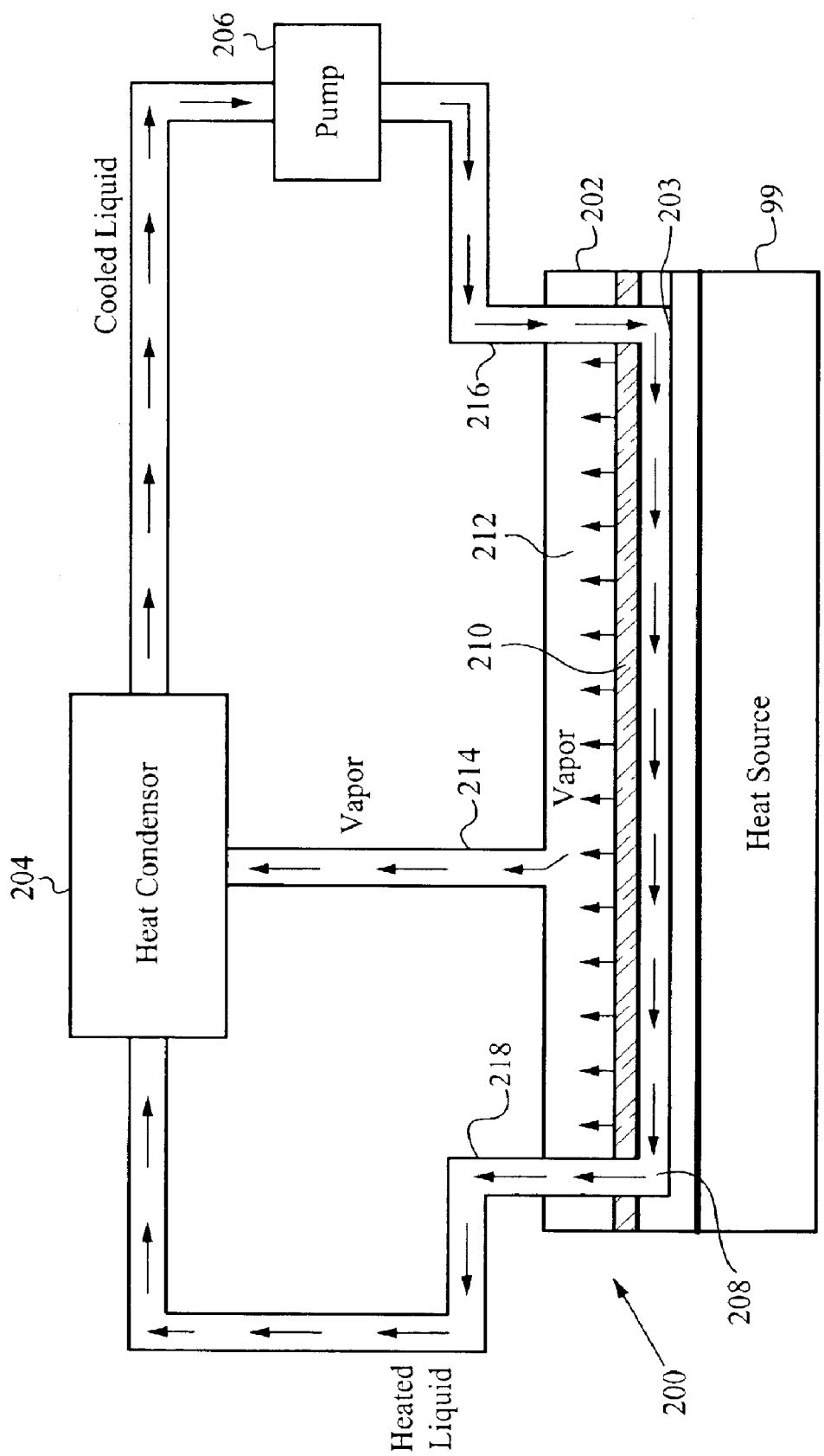
FIG. 4 illustrates a schematic drawing of a preferred closed loop system in accordance with the present invention.

In this alternative embodiment, as shown in FIG. 2B, the heat pipe 100' includes a wicking structure 118' coated with the vapor-permeable membrane 112', whereby the membrane 112' removes vapor from the area surrounding the wicking structure 118'. In particular, the wicking structure 118' is configured to include the porous membrane 112' on its top region, whereby the membrane 112' is hydrophobic, or otherwise liquid impermeable. In operation, the wicking structure 118' is saturated with liquid, whereby the liquid is heated through the interface 103'. The heated liquid boils and forms vapor, whereby the vapor transfers through the membrane 112' into the vapor region 104' shown in FIG. 2B. As vapor is formed and removed from the wick 118', the wick 118' begins to dry up and becomes less effective. Therefore, more liquid is pumped into the wicking structure 118' to keep the wicking structure 118' sufficiently loaded. The removal of vapor from the wicking structure 118' reduces the pressure differential within the liquid chamber 102' and liquid is delivered to the wicking structure 118' with less needed pumping power. In addition, the membrane 112' confines the liquid to the wicking structure 118' and prevents the liquid from oversaturating the wicking structure 118' causing the liquid to 'bubble over'. As stated above, the pumping power can be assisted by additional forces promoting liquid flow. These forces are supplied by alternatively using a thermosyphon pump, hydraulic pump, or a conventional pump (FIG. 4).

Referring to FIG. 2A, since the membrane 112 of the present invention removes the vapor from the liquid chamber 102, only liquid remains within the liquid chamber 102 and is in contact with the interface 103. Referring to FIG. 4, the interface 103 preferably includes an array of channels 114 having a large surface-to-volume ratio which minimizes the thermal resistance between the liquid and the channels 114 as well as the walls of the liquid chamber 102. In addition, the removal of vapor and retention of liquid within the liquid chamber 102 greatly reduces the pressure drop between the inlet port 106 and the liquid outlet port 108 in the liquid chamber 102. The reduction in the pressure drop thereby creates a relatively constant pressure within the liquid chamber 102, whereby a constant flowrate of liquid is applied to adequately cool the heat producing device 99 without the use of the extra pumping power. In addition, removal of vapor from the liquid chamber 102 allows more available volume within the liquid chamber 102 to hold the liquid.

Figure 3A:
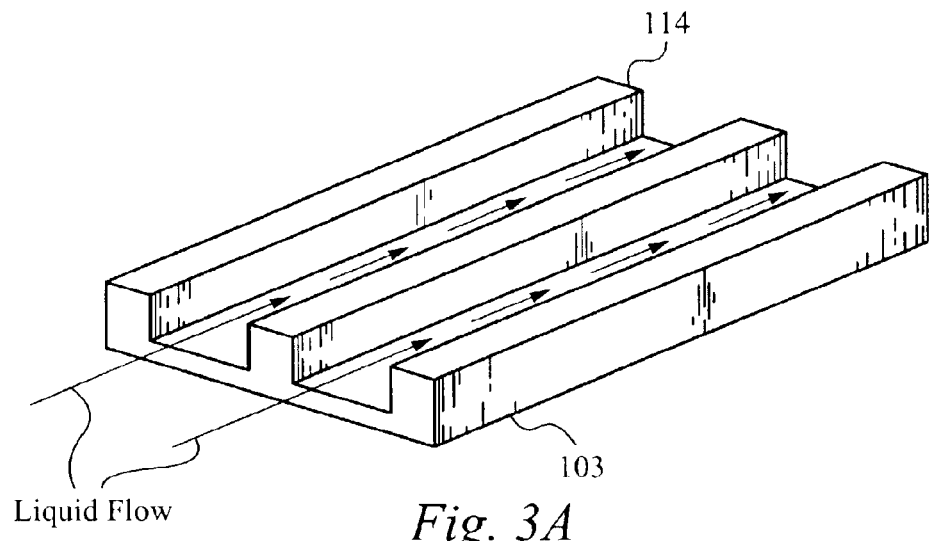
FIGS. 3A–3E illustrate different embodiments of the heat exchange interface in accordance with the present invention.
Figure 3B:
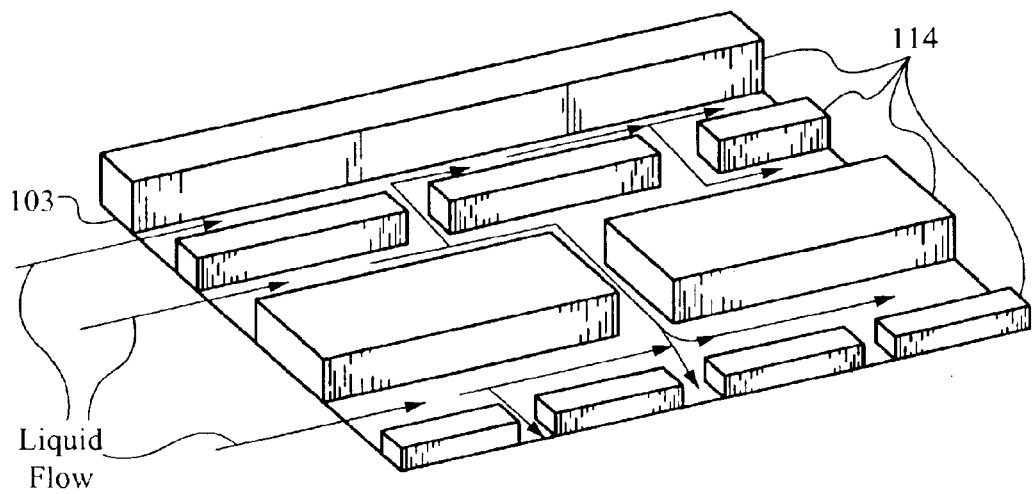
Figure 3C:
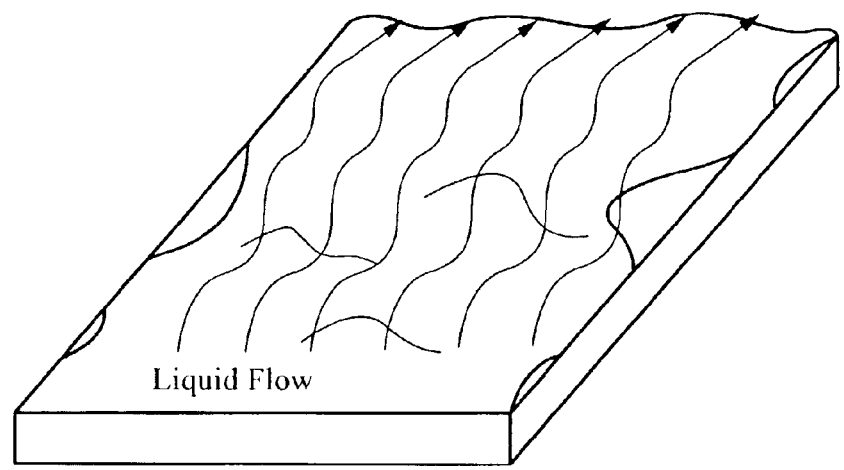
Figure 3D:
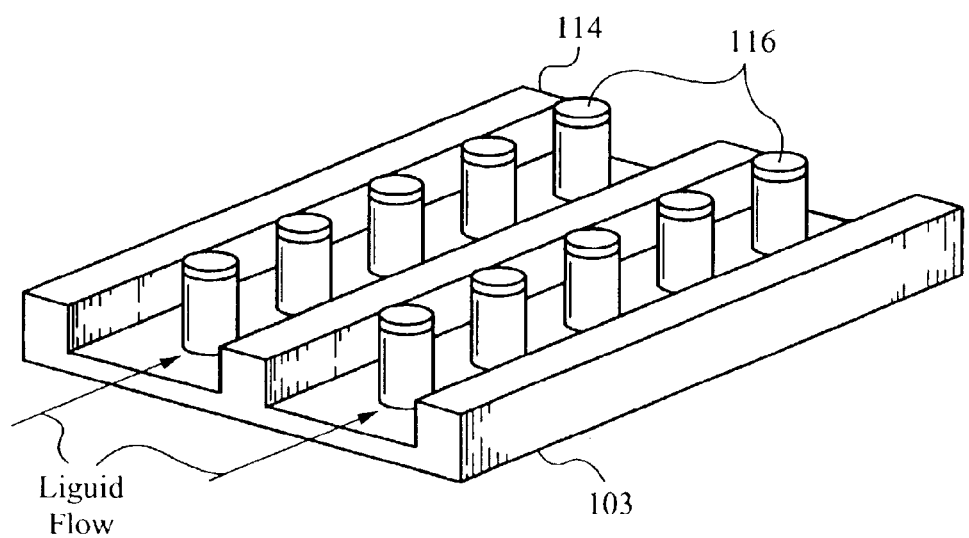
Figure 3E:
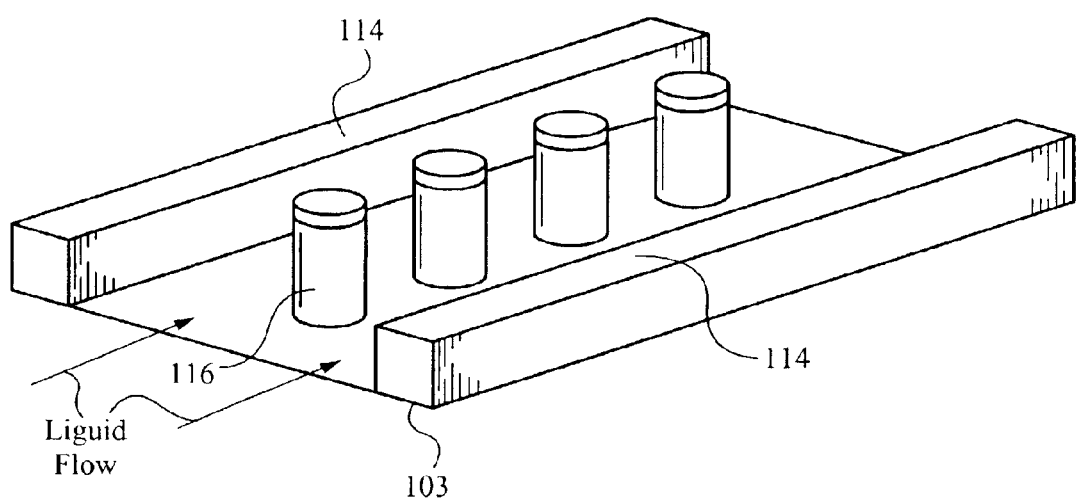

The heat exchange interface 103 of the heat exchanger 100 includes a variety of configurations. As shown in FIG. 3A, the interface bottom surface 103 of the liquid chamber 102 preferably includes an array of parallel microchannels 114. The liquid flows between the channels 114 in an area having a width dimension range of 10–500 microns. Alternatively, the bottom surface 103 of the liquid chamber 102 includes a plurality of channels 114 having variable channel width and height dimensions and are configured with cross-linkages between neighboring channels, as shown in FIG. 3B. The cross linkages are apertures within the sidewalls of the channels 114 which directionally guide the liquid to a desired area along the interface 103. Alternatively, as shown in FIG. 3C, the bottom surface 103 of the liquid chamber 102 includes non-planar features such as roughened surfaces 115. Alternatively, the interface includes a combination of the above mentioned features. Alternatively, the liquid chamber 102 includes an array of pillars 116 within multiple channels 114, as shown in FIG. 3D, or an array of pillars 116 within a single large channel 114, shown in FIG. 3E. In particular, each pillar 116 is attached to the membrane 112 to support the membrane 112 such that the pressure within the liquid chamber 102 does not break the liquid seal between the membrane 112 and the liquid chamber 102. The array of pillars 116 are attached to the bottom surface of the membrane 112 and alternatively to the top surface of the membrane 112. In addition, the array of pillars 116 are alternatively attached to the top and bottom surfaces of the membrane 112.

These features in the interface 103 promote control of the heat exchange with the liquid by directing the liquid to the regions of the heat source 99 needing more continuous flow of the liquid. These channeling features also help reduce temperature differences on the surface of the heat source by cooling the higher heat flux areas with more liquid flow while supplying the lesser heated areas of the device 99 with less liquid flow. Such configurations include a high surface-to volume ratio and promote lateral flow of the liquid in the liquid chamber 103 of the heat exchanger 100. It should be noted that other configurations along the interface 103 are contemplated so long as the surface-to-volume ratio of the features in the interface 103 is large enough to result in a low thermal resistance between the interface 103 and the liquid.

FIG. 4 illustrates a schematic of a loop system 200 utilizing the heat exchanger 202 having the membrane 112 of the present invention. Preferably, the loop 200 of the present invention is used to cool a heat producing device 99. Alternatively, the loop 200 of the present invention is used to heat up a device 99 which is cold. The heat exchanger 202 of the present invention is coupled to a heat producing element 99, such as a microprocessor. The heat exchanger 100 is also coupled to a heat rejector or heat condenser 204. The heat exchanger 100 is also preferably coupled to a pump 206 which pumps the cooled liquid to the liquid inlet port 106 (FIG. 2). One type of pump utilized in the loop shown in FIG. 4 is described in detail in a copending patent application having Ser. No. 10/366,121, filed on Feb. 12, 2003 entitled, "MICRO-FABRICATED ELECTROKINETIC PUMP" which is hereby incorporated by reference.

Alternatively, the heat exchanger 100 utilizes gravitational forces to pump the liquid throughout the system i.e. thermosyphon. Alternatively, the heat exchanger 100 utilizes hydraulic pumping techniques or capillary pumping techniques. Alternatively, the system utilizes a combination of the above pumping techniques or any other pumping techniques. In the preferred embodiment, as shown in FIG. 4, liquid such as water, circulates around the cooling loop 200 to cool the microprocessor 99. Alternatively, the liquid is any other appropriate solution, as discussed above.

In the loop 200 of the present invention, the liquid enters into the microchannel heat exchanger 202 through the liquid inlet port 216 at a predetermined temperature and flow rate across the heat exchange interface 203 in the liquid chamber 208. In the preferred embodiment, the heat source 99 has a temperature in a range between 0 and 200 degrees Celsius. However, it is preferred that the heat source 99 has a temperature between 45 and 95 degrees. In the preferred embodiment, the liquid flows through the liquid chamber 208 and the heat produced by the heat source 99 is transferred through the interface 203 of the heat exchanger 202 by means of convection. This heat transfer causes the temperature of the liquid to rise to the point in which some of the liquid begins boiling and undergoes a phase change. During the phase change, some of the liquid turns into vapor within the liquid chamber 208.

As stated above, the membrane 210 is hydrophobic and is in sealable engagement with the liquid chamber 208 such that the liquid does not enter the vapor chamber 212 when passing through the liquid chamber 208. The removal of vapor from the liquid chamber 208 preferably leaves only liquid within the liquid chamber 208, whereby, in the preferred embodiment, only the liquid flows along the interface and exits out the liquid outlet port 218 at a raised temperature. Alternatively, a small amount of vapor remains in the liquid chamber 208 and exits with the liquid out the liquid outlet port 216 at a raised temperature. Alternatively, as in a heat pipe, the liquid is continuously pumped into the wicking structure as the vaporized liquid exists the vapor chamber 212. The temperature of the liquid, depending on the type of application, ranges between −15 and 190 degrees Celsius. However, it is preferred that the exit temperature of the liquid is in the range of 30 to 95 degrees Celsius.

As stated above, the vapor chamber 212 within the heat exchanger 202 preferably has a lower pressure than that in the liquid chamber 208. Thus, the pressure differential between the two chambers, 208, 212 causes the less dense vapor to flow toward the vapor chamber 212. In the microchannel heat exchanger 202, the vapor naturally rises toward the membrane 210 and passes through the apertures 105 (FIG. 2A) of the membrane 210 into the vapor chamber 212. The vapor collected within the vapor chamber 212 then exits the vapor outlet port 214. The boiling of the liquid within the heat exchanger 202 may generate salt and/or other deposits which spread to all parts of the system 200. The pump 206 in the system 200 cleans the system 200 of salt and/or the other deposits by suddenly increasing the flow rate of the liquid, whereby the increased surge of liquid flow which is within the heat exchanger 202 exits through the liquid outlet port 218. Alternatively, the pump 206 reverses the direction of flow, whereby the liquid exits the heat exchanger 202 through the inlet port 216.

In the preferred system, as shown in FIG. 4, vapor exiting the vapor outlet port 214 flows directly to the heat rejector 204, whereby the vapor is cooled within the heat rejector 204 to form liquid. The condensed liquid formed within the rejector 204 then flows through the pump back to the liquid inlet port 216. Alternatively, the vapor is recombined with the heated liquid output from the heat exchanger 202 at a predetermined point in the loop 200, whereby the mixture flows to the heat rejector 204 and condenses back into liquid. Alternatively, the vapor exiting the vapor outlet port 214 is not condensed by the heat condenser 204 and does not flow back to the heat exchanger 202. Therefore, all the liquid in the bottom chamber 208 eventually heats up to become vapor which exits the heat exchanger 202 wherein only the vapor is condensed into liquid and pumped back to the inlet port 216 of the heat exchanger 200.

Figure 5A:
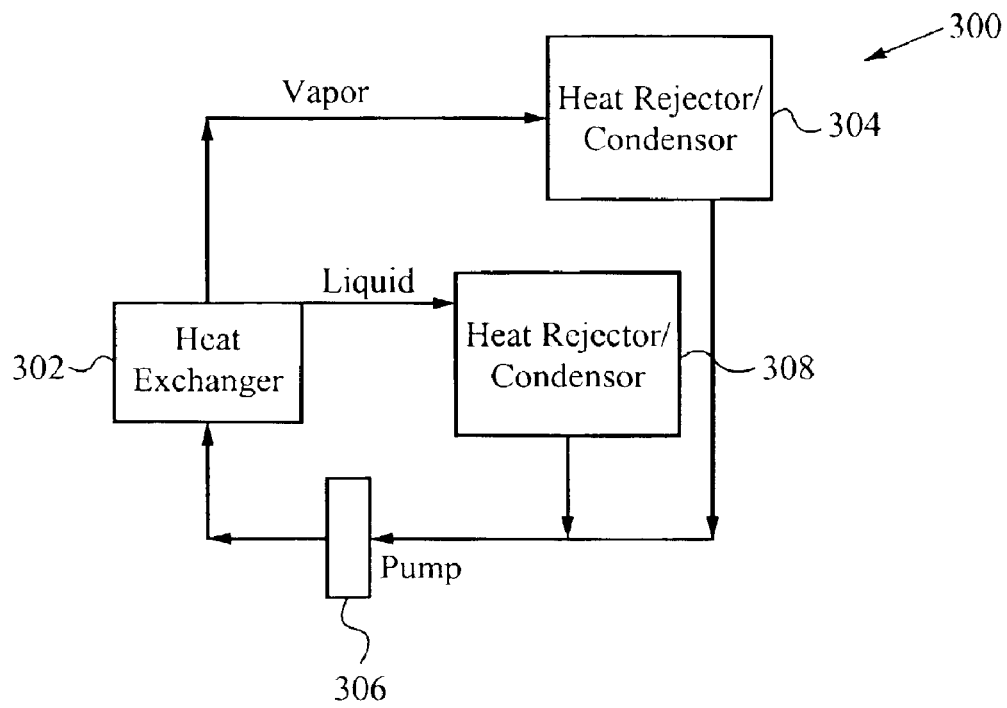
FIG. 5A illustrates a schematic of an alternate closed loop system utilizing the heat exchanger of the present invention.

In an alternative embodiment, as shown in FIG. 5A, the loop 300 includes the heat exchanger 302 of the present invention coupled with two independent heat condensers 304, 308 and a pump 306. In the alternative embodiment in FIG. 5A, the heated liquid flows out of the heat exchanger 302 to a one-phase heat rejector 308 which cools the heated liquid and sends the cooled liquid to the pump 306 which pumps the liquid back into the heat exchanger 302. In addition, as shown in FIG. 5A, the vapor in the heat exchanger 302 passes to a two-phase heat rejector 304 which cools and condenses the vapor into cooled liquid. The cooled liquid flows out of the two-phase heat rejector 304 to the pump 306 and back to the heat exchanger 302. Although the heat rejectors 308, 304 discussed above in regards to FIG. 5A are one- and two-phase rejectors respectively, both heat rejectors 308, 304 are alternatively two-phase rejectors.

Figure 5B:
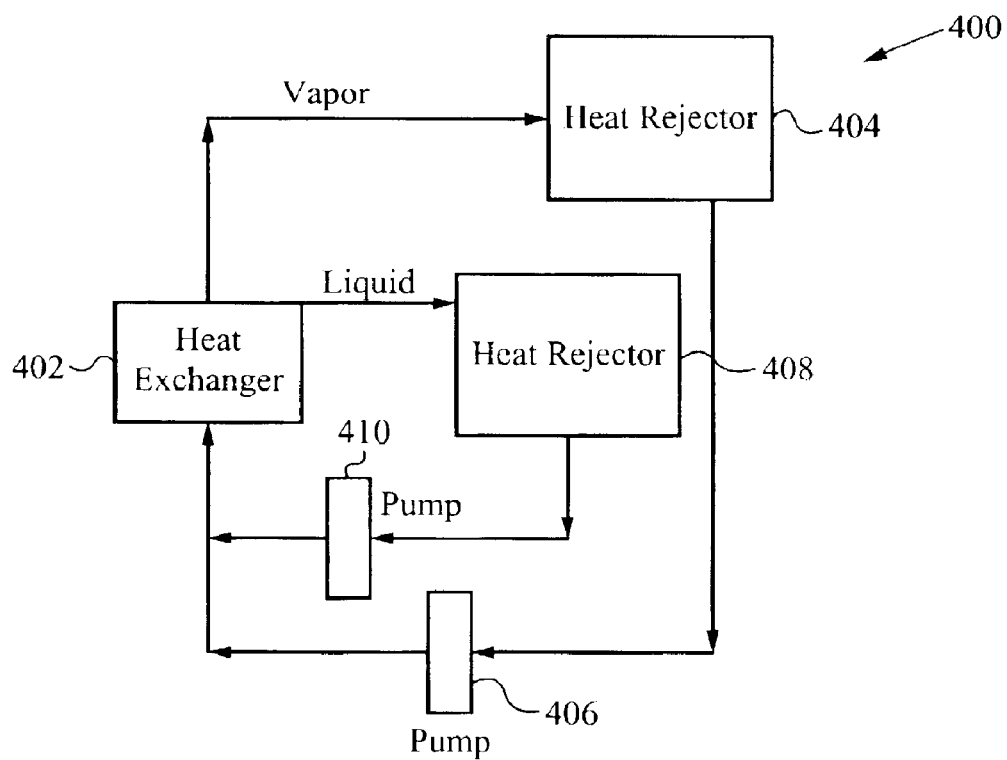
FIG. 5B illustrates a schematic of an alternate closed loop system utilizing the heat exchanger of the present invention.

In another alternate embodiment, as shown in FIG. 5B, the loop 400 includes a heat exchanger 402 coupled to two heat rejectors 404, 408 and two pumps 406, 410. The two pumps 406, 410 in the system 400 provide more control over the relative flow rate of liquid between the two rejectors 404, 408. As shown in FIG. 5B, the pump 406 is coupled with the heat exchanger 402 and the heat rejector 404, whereby the cooled, condensed liquid out of the heat rejector 404 flows through the pump 406 into the heat exchanger 402. In addition, the pump 410 is coupled with the heat exchanger 402 and the heat rejector 408, whereby the cooled liquid flowing out of the heat rejector 408 flows through the pump 410 into the heat exchanger 402. Alternatively, the pump 410 is positioned upstream of the heat rejector 408, whereby the heated liquid out of the heat exchanger 402 flows through the pump 406 and into the heat rejector 408.

Figure 5C:
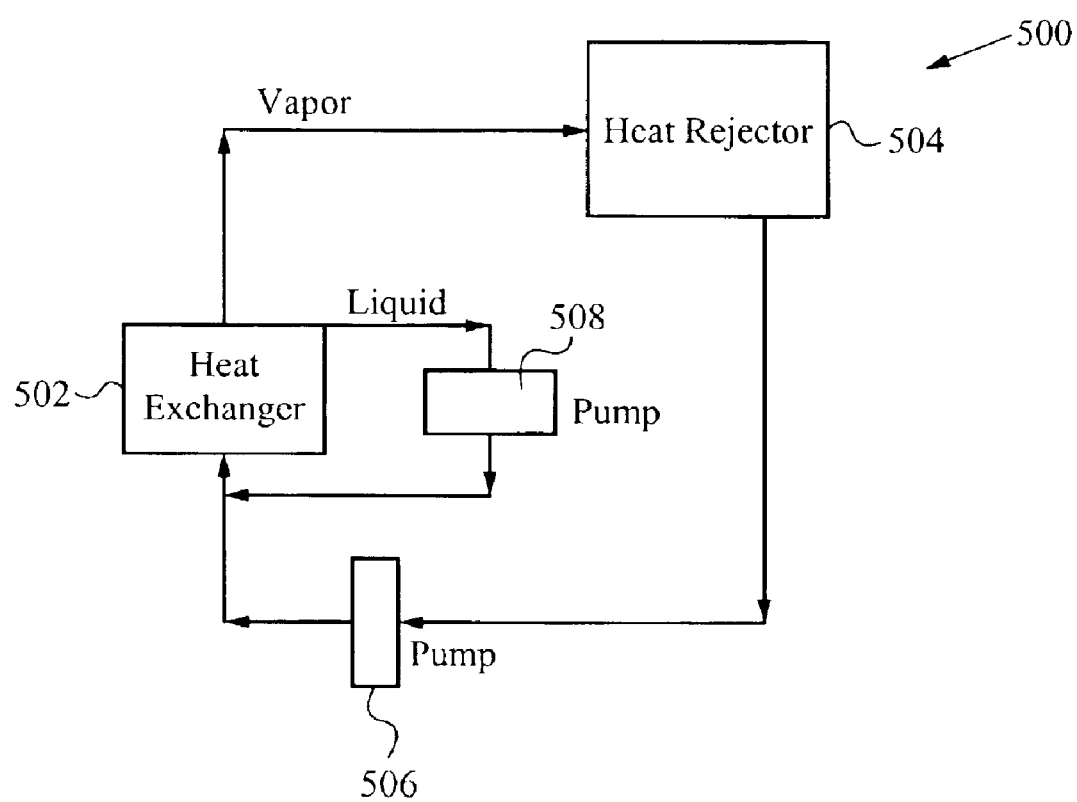
FIG. 5C illustrates a schematic of an alternate closed-loop system utilizing the heat exchanger of the present invention.
Figure 6A:
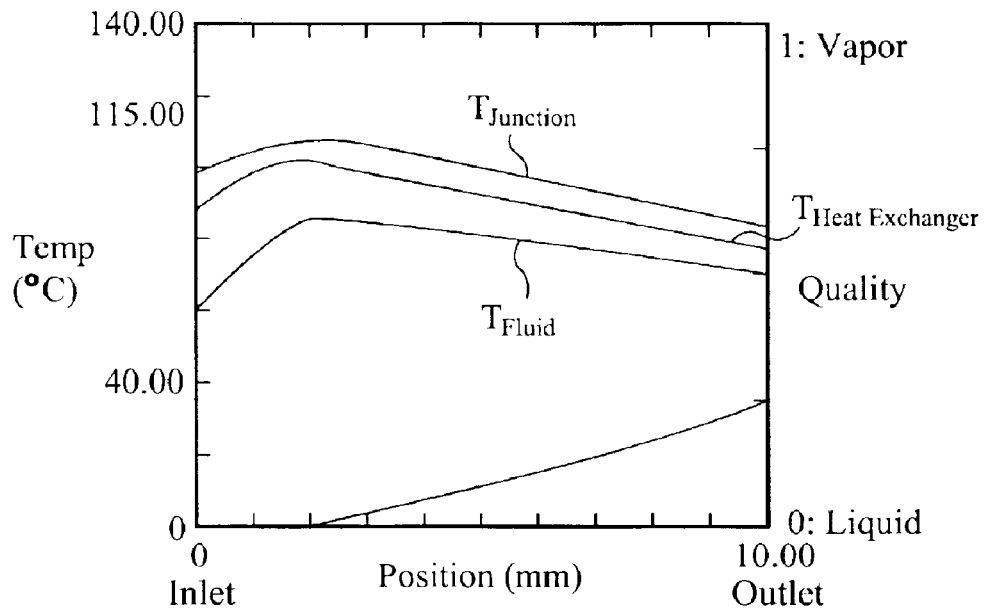
FIG. 6A illustrates experimental data indicating the temperature distribution difference of heated fluid along a channel of a conventional heat exchanger coupled to a microprocessor chip.
Figure 6B:
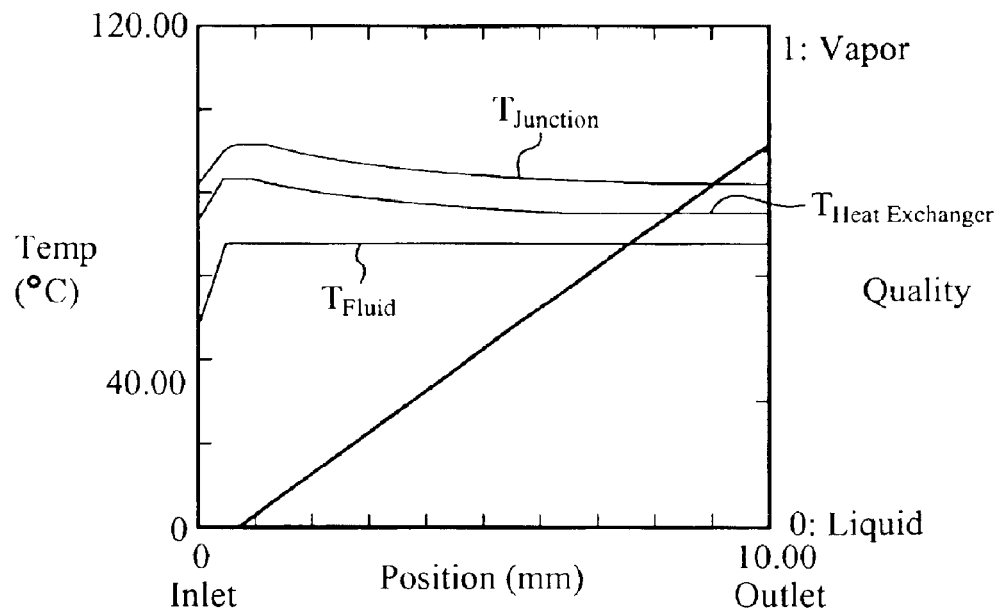
FIG. 6B illustrates experimental data indicating the temperature distribution difference of heated fluid along a channel of the present heat exchanger coupled to a microprocessor chip.

In another alternative embodiment, as shown in FIG. 5C, the loop 500 includes a heat exchanger 502 coupled to one heat rejector 504 and two pumps 506, 508. In this alternate embodiment, the heat exchanger 502 outputs vapor to the heat rejector 504 which condenses the vapor back into liquid. The cooled liquid is then pumped through the pump 506 to the inlet of the heat exchanger 502. Also, the heat exchanger 502 outputs the heated liquid flowing out of the liquid outlet port 218 (FIG. 4) directly to the pump 508, whereby the pump 508 pumps the heated liquid back into the heat exchanger 502. The heated liquid entering the heat exchanger 502 then eventually becomes vapor. This loop configuration ensures that the temperature and pressure of the liquid entering the heat exchanger 502 is near the point at which the liquid would boil.

FIG. 5A illustrates experimental data indicating the temperature distribution difference of the fluid along a channel of a conventional heat exchanger that is coupled to a microprocessor chip. In particular, the microchannel heat exchanger cools a 150 W chip at a liquid flowrate of 14.1 ml/min, wherein the pump operates at 8 W. As discussed above, a large pressure difference is induced across the channel of the heat exchanger during phase change of the liquid chamber and causes temperature variations across the chip.

FIG. 5B illustrates experimental data indicating the temperature distribution difference of the fluid along a channel of the heat exchanger having the membrane of the present invention. The system of the present invention operates at higher exit quality due to the uniformity of the liquid temperature across the heat exchanger and lack of instabilities associated with the mixing of the liquid and vapor phases in the heat exchanger. In addition to the improved temperature uniformity, the system will operate at a much lower pressure drop than the system described in FIG. 5A.

As stated above, in existing heat exchangers having many parallel channels, the boiling of the liquid in some of the channels induces a dramatic increase in the pressure drop across those channels due to mixing of the liquid and vapor phases. As a result, the flowrate in those channels is reduced, leading to a temporal instability and dry out and a substantial increase in the temperature of the heat producing device. Thus, in existing cooling systems, the exit quality of the heat exchanger is limited to a smaller number, such as 0.2–0.4, to avoid burnout and the temporal fluctuations between the channels along the surface adjacent to the heat producing device. The limitation of the exit quality leads to only a portion of the pumped fluid to boil, which thereby requires pumping the liquid at a higher flowrate to sufficiently cool the heat producing device. In effect, the pump which pumps the liquid must throughout the system must work at a higher rate to maintain a high flowrate of cooling liquid. In contrast, the present invention substantially reduces temporal instabilities that result from the mixing of the vapor and liquid phases in the liquid being pumped through the heat exchanger. The vapor escape alleviates the large pressure drop in the channels in which boiling occurs, allowing the system to operate stably at exit qualities that are higher in comparison to the existing cooling systems. In addition, high qualities of the system and the small pressure drop allow the pump used in the present cooling system to work at a lower wattage.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modification s may be made in the embodiment chosen for illustration without departing from the spirit and scope of the invention.

What is claimed is:

1. A microchannel heat exchanger for removing heat from a heat producing device comprising:
   a. a first chamber for channeling liquid along a surface configured to transfer heat between the heat exchanger and the heat producing device, thereby heating the liquid;
   b. a second chamber for collecting vapor from the heated liquid within the first chamber;
   c. a substantially hydrophobic porous membrane for passing vapor from the first chamber to the second chamber, the porous membrane positioned between the first chamber and the second chamber and configured to substantially retain liquid within the first chamber; and
   d. a third port coupled to the first chamber, wherein heated liquid exits the third port.

2. The microchannel heat exchanger according to claim 1 wherein the liquid enters the channel through a first port.

3. The microchannel heat exchanger according to claim 2 wherein the vapor collected within the second chamber exits the second chamber through a second port.

4. The microchannel heat exchanger according to claim 1 wherein all of the heated liquid in the first chamber becomes vapor and exits through the second port.

5. The microchannel heat exchanger according to claim 1 wherein the porous membrane is operatively coupled to the first chamber.

6. The microchannel heat exchanger according to claim 3 wherein the liquid enters the first port at a first temperature and exits the second port at a second temperature.

7. The microchannel heat exchanger according to claim 1 wherein the surface of the first chamber includes an array of channels positioned in a predetermined pattern.

8. The microchannel heat exchanger according to claim 7 wherein one channel in the array has at least one dimension dissimilar to an adjacent channel.

9. The microchannel heat exchanger according to claim 7 wherein at least one channel further comprises a channel aperture for channeling the liquid to an adjacent channel.

10. The microchannel heat exchanger according to claim 1 wherein the surface includes a roughened configuration.

11. The microchannel heat exchanger according to claim 1 wherein the first chamber further comprises an array of pillars configured in a predetermined pattern.

12. The microchannel heat exchanger according to claim 1 wherein the porous membrane further comprises a plurality of apertures for allowing vapor to pass therethrough, each aperture having a predetermined dimension.

13. The microchannel heat exchanger according to claim 1 further comprising an interface material positioned between the microchannel heat exchanger and the heat producing device.

14. The microchannel heat exchanger according to claim 1 wherein the microchannel heat exchanger is integrally configured with the heat producing device.

15. A microchannel heat exchanger comprising:
 a. a first port for receiving liquid having a first temperature;
 b. a heat transferring element for channeling the liquid from the first port along an interface, wherein the vapor is generated while the liquid flows along the interface;
 c. a substantially hydrophobic membrane for separating vapor from the liquid, the membrane configured to transfer the vapor to a separate element and confine the liquid to the interface, wherein a majority of vapor exits through a second port in the separate element; and
 d. a third port coupled to the heat transferring element, the third port for exiting liquid having a second temperature.

16. The microchannel heat exchanger according to claim 15 wherein the second temperature is higher than the first temperature.

17. The microchannel heat exchanger according to claim 15 wherein the second temperature is lower than the first temperature.

18. The microchannel heat exchanger according to claim 15 wherein the heat transferring element further comprises an array of channels positioned in a predetermined pattern.

19. The microchannel heat exchanger according to claim 15 wherein all of the heated liquid in the first chamber becomes vapor and exits through the second port.

20. The microchannel heat exchanger according to claim 18 wherein at least one channel in the array has a dimension different than an adjacent channel.

21. The microchannel heat exchanger according to claim 18 wherein at least one channel further comprises at least one channel aperture for channeling the liquid to an adjacent channel.

22. The microchannel heat exchanger according to claim 15 wherein the interface is roughened.

23. The microchannel heat exchanger according to claim 15 wherein the first chamber further comprises an array of pillars configured in a predetermined pattern.

24. The microchannel heat exchanger according to claim 15 wherein the membrane further comprises a plurality of apertures, each of the apertures having a predetermined dimension within.

25. The microchannel heat exchanger according to claim 15 wherein the microchannel heat exchanger is coupled to a heat producing device, the heat producing device for providing heat to the microchannel heat exchanger via the heat transferring element.

26. The microchannel heat exchanger according to claim 25 further comprising an interface material positioned between the microchannel heat exchanger and the heat producing device.

27. The microchannel heat exchanger according to claim 25 wherein the microchannel heat exchanger is integrally configured with the heat producing device.

28. A closed circulation loop for cooling a heat producing device, the loop comprising:
 a. a heat exchanging element in contact with the heat producing device, the heat exchanging element further comprising:
  i. a first element for channeling a liquid along a beat transfer region, wherein the liquid at a first temperature enters the first element through a first port;
  ii. a substantially hydrophobic vapor permeable membrane coupled to the first element, the vapor permeable membrane configured to transfer vapor in the first element to a second port, the vapor permeable membrane confining the liquid within the first element; and
  iii. a third port coupled to the first element, wherein liquid having a third temperature confined within the first element exits the heat exchanging element through the third port; and
 b. at least one heat rejector for cooling the vapor at a second temperature to the first temperature, wherein the vapor is received from the second port, thereby providing the liquid at the first temperature to the first port.

29. The circulation loop according to claim 28 wherein all of the liquid in the first chamber is heated to vapor at the second temperature.

30. The circulation loop according to claim 28 further comprising a second heat rejector coupled to the heat exchanging element, the second heat rejector receives the liquid at the third temperature and cools the liquid to the first temperature, wherein the heat rejector provides the liquid at the first temperature to the first port.

31. The circulation loop according to claim 28 wherein the heat exchanging element further comprises a second element for holding vapor transferred through the vapor permeable membrane, the second element configured to induce vapor to transfer thereto, wherein the second element is coupled to the second port.

32. The circulation loop according to claim 28 further comprising at least one pump for pumping liquid to the heat exchanging element, wherein the at least one pump receives liquid at a predetermined temperature.

33. The circulation loop according to claim 32 wherein the predetermined temperature is substantially equivalent to the first temperature.

34. The circulation loop according to claim 32 wherein the predetermined temperature is substantially equivalent to the second temperature.

35. The circulation loop according to claim 32 wherein the predetermined temperature is substantially equivalent to the third temperature.

36. The circulation loop according to claim 32 wherein the pump further comprises a microchannel electrokinetic pump.

37. The circulation loop according to claim 32 wherein the pump further comprises a hydraulic pump.

38. The circulation loop according to claim 28 wherein the heat exchanging element further comprises a capillary pump having a wicking structure positioned along the heat transfer interface.

39. The circulation loop according to claim 38 wherein heat rejector is positioned at a first height above the heat exchanging element, wherein the liquid flows to the heat exchanging element using gravitational forces.

40. The circulation loop according to claim 39 wherein the capillary pump further comprises a thermosyphon pump utilizing the gravitational forces to pump the liquid to the heat exchanging element.

41. A substantially hydrophobic vapor escape membrane for use in a heat exchanging device, the heat exchanging device passing liquid into a heat transfer region positioned adjacent to the heat producing device, the heat exchanging device includes a heat sink having a plurality of microchannels configured in a predetermined pattern in the heat transfer region, the vapor escape membrane comprising: a porous surface for removing vapor produced from the liquid in the cooling region, the membrane configured to confine the liquid only within the cooling region.

42. The vapor escape membrane according to claim 41 wherein the vapor escape membrane transfers vapor to a vapor region within the heat exchanging device, wherein the membrane is configured to prevent liquid in the heat transfer region from entering the vapor region.

43. The vapor escape membrane according to claim 42 wherein the membrane is configured to include a hydrophobic surface between the membrane and the heat transfer region, wherein the liquid in the heat transfer region does not flow through the porous surface.

44. The vapor escape membrane according to claim 41 wherein the heat exchanging device further comprises a heat pipe configuration having a wick structure positioned within the heat transfer region.

45. The vapor escape membrane according to claim 41 further comprising a plurality of apertures for allowing vapor to transfer therethrough, each of the apertures having a predetermined dimension.

46. A method of assembling a microchannel heat exchanger for cooling a heat producing device comprising:
  a. providing a liquid chamber having a surface for transferring heat between the heat producing device and liquid flow along the surface, wherein the surface is patterned into a desired configuration;
  b. coupling a vapor chamber to the liquid chamber, wherein the vapor chamber is configured in a predetermined position with respect to the liquid chamber; and
  c. configuring a substantially hydrophobic vapor permeable membrane between the vapor chamber and the liquid chamber, the vapor permeable membrane operatively coupled with the liquid chamber such that only vapor formed in liquid chamber flows to the vapor chamber.

47. The method according to claim 46 further comprising coupling an inlet port to the liquid chamber, the inlet port configured to provide liquid having a first temperature to the microchannel heat exchanger.

48. The method according to claim 46 further comprising coupling an outlet port to the liquid chamber, the outlet port configured to exit liquid having a second temperature from the microchannel heat exchanger.

49. The method according to claim 46 further comprising coupling an outlet port to the vapor chamber, the outlet port configured to remove vapor present within the vapor chamber.

50. A microchannel heat exchanger comprising:
  a. means for channeling a fluid in a liquid state along a heat exchange interface patterned into a desired configuration, wherein vapor is produced within the means for channeling; and
  b. substantially hydrophobic means for removing the vapor from the means for channeling, the means for removing operatively coupled to the means for channeling such that the fluid in the liquid state is retained along the heat exchange interface.

51. The microchannel heat exchanger according to claim 50 further comprising means for collecting the vapor passing through the means for removing, wherein the vapor within the means for collecting exits through a vapor outlet.

52. The microchannel heat exchanger according to claim 50 wherein the means for removing is positioned above the channeling means.

53. A microchannel heat exchanger for removing heat from a heat producing device comprising:
  a. a first chamber for channeling liquid along a surface configured to transfer heat between the heat exchanger and the heat producing device, thereby heating the liquid, wherein the surface includes an array of channels positioned in a predetermined pattern;
  b. a second chamber for collecting vapor from the heated liquid within the first chamber; and
  c. a substantially hydrophobic porous membrane for passing vapor from the first chamber to the second chamber, the porous membrane positioned between the first chamber and the second chamber and configured to substantially retain liquid within the first chamber.

54. The microchannel heat exchanger according to claim 53 wherein one channel in the array has at least one dimension dissimilar to an adjacent channel.

55. The microchannel heat exchanger according to claim 53 wherein at least one channel further comprises a channel aperture for channeling the liquid to an adjacent channel.

56. A microchannel heat exchanger for removing heat from a heat producing device comprising:
  a. a first chamber for channeling liquid along a surface configured to transfer heat between the heat exchanger and the heat producing device, thereby heating the liquid, wherein the surface includes a roughened configuration;
  b. a second chamber for collecting vapor from the heated liquid within the first chamber; and
  c. a substantially hydrophobic porous membrane for passing vapor from the first chamber to the second chamber, the porous membrane positioned between the first chamber and the second chamber and configured to substantially retain liquid within the first chamber.

57. A microchannel heat exchanger for removing heat from a heat producing device comprising:
  a. a first chamber for channeling liquid along a surface configured to transfer heat between the heat exchanger and the heat producing device, thereby heating the liquid;
  b. a second chamber for collecting vapor from the heated liquid within the first chamber; and
  c. a substantially hydrophobic porous membrane for passing vapor from the first chamber to the second chamber, the porous membrane positioned between the first chamber and the second chamber and configured to substantially retain liquid within the first chamber,
  wherein the microchannel heat exchanger is integrally configured with the heat producing device.

58. A microchannel heat exchanger comprising:
a. a first port for receiving liquid having a first temperature;
b. a heat transferring element for channeling the liquid from the first port along an interface, the heat transferring element including an array of channels positioned in a predetermined pattern, wherein a vapor is generated while the liquid flows along the interface; and
c. a substantially hydrophobic membrane for separating vapor from the liquid, the membrane configured to transfer the vapor to a separate element and confine the liquid to the interface, wherein a majority of vapor exits through a second port in the separate element.

59. The microchannel heat exchanger according to claim 58 wherein at least one channel in the array has a dimension different than an adjacent channel.

60. The microchannel heat exchanger according to claim 58 wherein at least one channel further comprises at least one channel aperture for channeling the liquid to an adjacent channel.

61. A microchannel heat exchanger comprising:
a. a first port for receiving liquid having a first temperature;
b. a heat transferring element for channeling the liquid from the first port along a roughened interface, wherein the vapor is generated while the liquid flows along the roughened interface; and
c. a substantially hydrophobic membrane for separating vapor from the liquid, the membrane configured to transfer the vapor to a separate element and confine the liquid to the roughened interface, wherein a majority of vapor exits through a second port in the separate element.

62. A microchannel heat exchanger comprising:
a. a first port for receiving liquid having a first temperature;
b. a heat transferring element for channeling the liquid from the first port along a interface, wherein the vapor is generated while the liquid flows along the interface; and
c. a substantially hydrophobic membrane for separating vapor from the liquid, the membrane configured to transfer the vapor to a separate element and confine the liquid to the interface, wherein a majority of vapor exits through a second port in the separate element,
wherein the microchannel heat exchanger is integrally configured with a heat producing device, the heat producing device for providing heat to the microchannel heat exchanger via the heat transferring element.

63. A closed circulation loop for cooling a heat producing device, the loop comprising:
a. a heat exchanging element in contact with the heat producing device, the heat exchanging element further comprising:
   i. a first element for channeling a liquid along a heat transfer region, wherein the liquid at a first temperature enters the first element through a first port; and
   ii. a substantially hydrophobic vapor permeable membrane coupled to the first element, the vapor permeable membrane configured to transfer vapor in the first element to a second port, the vapor permeable membrane confining the liquid within the first element;
   iii. a third port coupled to the first element, wherein liquid having a third temperature confined within the first element exits the heat exchanging element through the third port; and
b. at least one heat rejector for cooling the vapor at a second temperature to the first temperature, wherein the vapor is received from the second port, thereby providing the liquid at the first temperature to the first port; and
c. at least one pump for pumping liquid to the heat exchanging element, wherein the at least one pump receives liquid at a predetermined temperature.

64. The circulation loop according to claim 63 wherein the predetermined temperature is substantially equivalent to the first temperature.

65. The circulation loop according to claim 63 wherein the predetermined temperature is substantially equivalent to the second temperature.

66. The circulation loop according to claim 63 wherein the predetermined temperature is substantially equivalent to the third temperature.

67. The circulation loop according to claim 63 wherein the pump further comprises a microchannel electrokinetic pump.

68. The circulation loop according to claim 63 wherein the pump further comprises a hydraulic pump.

69. A method of assembling a microchannel heat exchanger for cooling a heat producing device comprising:
a. providing a liquid chamber having a surface for transferring heat between the heat producing device and liquid flow along the surface, wherein the surface is patterned into a desired configuration;
b. coupling a vapor chamber to the liquid chamber, wherein the vapor chamber is configured in a predetermined position with respect to the liquid chamber;
c. configuring a substantially hydrophobic vapor permeable membrane between the vapor chamber and the liquid chamber, the vapor permeable membrane operatively coupled with the liquid chamber such that only vapor formed in liquid chamber flows to the vapor chamber; and
d. coupling an outlet port to the liquid chamber, the outlet port configured to exit liquid having a second temperature from the microchannel heat exchanger.

* * * * *

UNITED STATES PATENT AND TRADEMARK OFFICE
CERTIFICATE OF CORRECTION

PATENT NO. : 6,994,151 B2
DATED : February 7, 2006
INVENTOR(S) : Peng Zhou, Kenneth Goodson and Juan Santiago It is certified that error appears in the above-identified patent and that said Letters Patent is hereby corrected as shown below:

<u>Title page,</u>
Item [75], Inventors, replace "Suntiago" with -- Santiago --.
Item [56], References Cited, U.S. PATENT DOCUMENTS, add the following:
-- 5,835,345    11/1998    Staskus et al.
   5,858,188    1/1999     Soane et al.
   5,863,708    1/1999     Zanzucchi et al.
   5,870,823    2/1999     Bezama et al.
   5,880,524    3/1999     Xie
   5,874,795    2/1999     Sakamoto
   5,901,037    5/1999     Hamilton et al.
   5,936,192    8/1999     Tauchi
   5,964,092    10/1999    Tozuka et al.
   5,965,001    10/1999    Chow et al. --.

<u>Column 12,</u>
Line 64, replace "the" with -- a -- between "through" and "second".

<u>Column 13,</u>
Line 52, replace "the" with -- a -- between "in" and "first".
Line 64, replace "the" with -- a -- between "wherein" and "first".

<u>Column 14,</u>
Line 20, replace "beat" with -- heat --.
Line 38, replace "the" with -- a -- between "in" and "first".

Signed and Sealed this

Twenty-fifth Day of April, 2006

JON W. DUDAS
*Director of the United States Patent and Trademark Office*